(12) United States Patent
Lee

(10) Patent No.: US 11,417,603 B2
(45) Date of Patent: Aug. 16, 2022

(54) SEMICONDUCTOR DEVICES

(71) Applicant: SAMSUNG ELECTRONICS CO., LTD., Suwon-si (KR)

(72) Inventor: Jaegoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 99 days.

(21) Appl. No.: 16/933,133

(22) Filed: Jul. 20, 2020

(65) Prior Publication Data

US 2021/0183771 A1 Jun. 17, 2021

(30) Foreign Application Priority Data

Dec. 17, 2019 (KR) .................... 10-2019-0168614

(51) Int. Cl.
| | |
|---|---|
| *H01L 23/535* | (2006.01) |
| *H01L 27/11519* | (2017.01) |
| *H01L 27/11556* | (2017.01) |
| *H01L 27/11565* | (2017.01) |
| *H01L 21/768* | (2006.01) |
| *H01L 23/522* | (2006.01) |

(Continued)

(52) U.S. Cl.
CPC ...... *H01L 23/535* (2013.01); *H01L 21/76805* (2013.01); *H01L 21/76895* (2013.01); *H01L 23/5226* (2013.01); *H01L 23/5283* (2013.01); *H01L 27/11519* (2013.01); *H01L 27/11556* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | |
|---|---|---|
| 9,202,780 B2 | 12/2015 | Lee et al. |
| 9,356,038 B2 | 5/2016 | Lee et al. |
| 9,362,226 B2 | 6/2016 | Lee et al. |

(Continued)

FOREIGN PATENT DOCUMENTS

KR 10-2015-0104817 A 9/2015

OTHER PUBLICATIONS

German Office action dated May 9, 2022.

*Primary Examiner* — Hsien Ming Lee
(74) *Attorney, Agent, or Firm* — Lee IP Law, P.C.

(57) ABSTRACT

A semiconductor device a substrate; conductive patterns on the substrate, the conductive patterns being spaced apart from each other in a vertical direction perpendicular to a surface of the substrate, and an edge of the conductive patterns including a step portion such that an end of one conductive pattern is not overlapped in the vertical direction with conductive patterns positioned thereover; insulation patterns between the conductive patterns; sidewall insulation patterns on the sidewalls of the conductive patterns to cover sidewalls of the conductive patterns; upper pad patterns on upper surfaces of the step portion of the conductive patterns and upper surfaces of a portion of the sidewall insulation patterns; an insulating interlayer covering the conductive patterns, the insulation patterns, the sidewall insulation patterns, and the upper pad patterns; and contact plugs passing through the insulating interlayer, the contact plugs contacting the upper pad patterns, respectively.

17 Claims, 30 Drawing Sheets

(51) Int. Cl.
*H01L 23/528* (2006.01)
*H01L 27/11582* (2017.01)

(56) References Cited

U.S. PATENT DOCUMENTS

| | | |
|---|---|---|
| 9,373,540 B2 | 6/2016 | Hyun |
| 9,941,153 B1 | 4/2018 | Yang |
| 9,997,526 B2 | 6/2018 | Sudo et al. |
| 10,312,138 B2 | 6/2019 | Hyun et al. |
| 10,403,641 B2 | 9/2019 | Kim et al. |
| 2016/0172296 A1 | 6/2016 | Lim et al. |
| 2016/0218107 A1 | 7/2016 | Lee et al. |
| 2017/0271354 A1 | 9/2017 | Kwak |
| 2019/0280001 A1 | 9/2019 | Terasawa et al. |
| 2021/0287989 A1* | 9/2021 | Greenlee ............... H01L 23/535 |

* cited by examiner

SEMICONDUCTOR DEVICES

CROSS-REFERENCE TO RELATED APPLICATION

Korean Patent Application No. 10-2019-0168614, filed on Dec. 17, 2019, in the Korean Intellectual Property Office, and entitled: "Semiconductor Devices," is incorporated by reference herein in its entirety.

BACKGROUND

1. Field

Embodiments relate to semiconductor devices.

2. Description of the Related Art

Recently, a vertical type memory device in which memory cells are vertically stacked from a surface of a substrate has been considered. Edge portions of stacked conductive patterns included in the memory cells may have a step shape, and upper surfaces of the edge portions may serve as pad patterns, respectively. A contact plug may be formed on each of the pad patterns.

SUMMARY

The embodiments may be realized by providing a semiconductor device including a substrate; conductive patterns on the substrate, the conductive patterns being spaced apart from each other in a vertical direction perpendicular to a surface of the substrate, and an edge of the conductive patterns including a step portion such that an end of one conductive pattern is not overlapped in the vertical direction with conductive patterns positioned thereover; insulation patterns between the conductive patterns; sidewall insulation patterns on sidewalls of the conductive patterns to cover the sidewalls of the conductive patterns; upper pad patterns on upper surfaces of the step portion of the conductive patterns and upper surfaces of portions of the sidewall insulation patterns; an insulating interlayer covering the conductive patterns, the insulation patterns, the sidewall insulation patterns, and the upper pad patterns; and contact plugs passing through the insulating interlayer, the contact plugs contacting the upper pad patterns, respectively.

The embodiments may be realized by providing a semiconductor device including a substrate; conductive patterns on the substrate, the conductive patterns being spaced apart from each other in a vertical direction perpendicular to a surface of the substrate, the conductive patterns including polysilicon, and an edge of the conductive patterns including a step portion such that an end of one conductive pattern is not overlapped in the vertical direction with conductive patterns positioned thereover; insulation patterns between the conductive patterns; sidewall insulation patterns on the sidewalls of the conductive patterns to cover sidewalls of the conductive patterns, the sidewall insulation patterns being on the insulation patterns, respectively; upper pad patterns on upper surfaces of the step portion of the conductive patterns and a portion of the sidewall insulation patterns, the upper pad patterns including polysilicon; an insulating interlayer covering the conductive patterns, the insulation patterns, the sidewall insulation patterns, and the upper pad patterns; a channel structure passing through the conductive patterns and the insulation patterns, the channel structure being connected to the substrate, and the channel structure including a dielectric layer structure, a channel, a buried insulation pattern, and an upper conductive pattern; and contact plugs passing through the insulating interlayer, the contact plugs contacting the upper pad patterns, respectively, wherein an upper surface of one upper pad pattern is closer to the substrate in the vertical direction than an upper surface of an adjacent sidewall insulation pattern that is one level higher than the one upper pad pattern is to the substrate in the vertical direction.

The embodiments may be realized by providing a semiconductor device including a substrate; conductive patterns on the substrate, the conductive patterns being spaced apart from each other in a vertical direction perpendicular to a surface of the substrate, the conductive patterns including polysilicon, and an edge of the conductive patterns including a step portion such that an end of one conductive pattern is not overlapped in the vertical direction with conductive patterns positioned thereover; insulation patterns between the conductive patterns; sidewall insulation patterns on the sidewalls of the conductive patterns, respectively, to cover sidewalls of the conductive patterns; upper pad patterns on upper surfaces of the step portion of the conductive patterns, the upper pad patterns including polysilicon; an insulating interlayer covering the conductive patterns, the insulation patterns, the sidewall insulation patterns, and the upper pad patterns; and contact plugs passing through the insulating interlayer, the contact plugs contacting the upper pad patterns, respectively, wherein a bottom of each of the contact plugs is at an upper surface or an inner portion of a stacked structure including one upper pad pattern and a lower conductive pattern contacting the one upper pad pattern, and a thickness of each of the upper pad patterns in the vertical direction is less than a thickness in the vertical direction of a structure in which one conductive pattern and one insulation pattern are stacked.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a direction substantially perpendicular to the upper surface of the substrate is defined as a vertical direction. Two directions substantially parallel to the upper surface of the substrate and crossing to each other are defined as first and second directions, respectively. In example embodiments, the first and second directions may be substantially perpendicular to each other.

Figure 1:
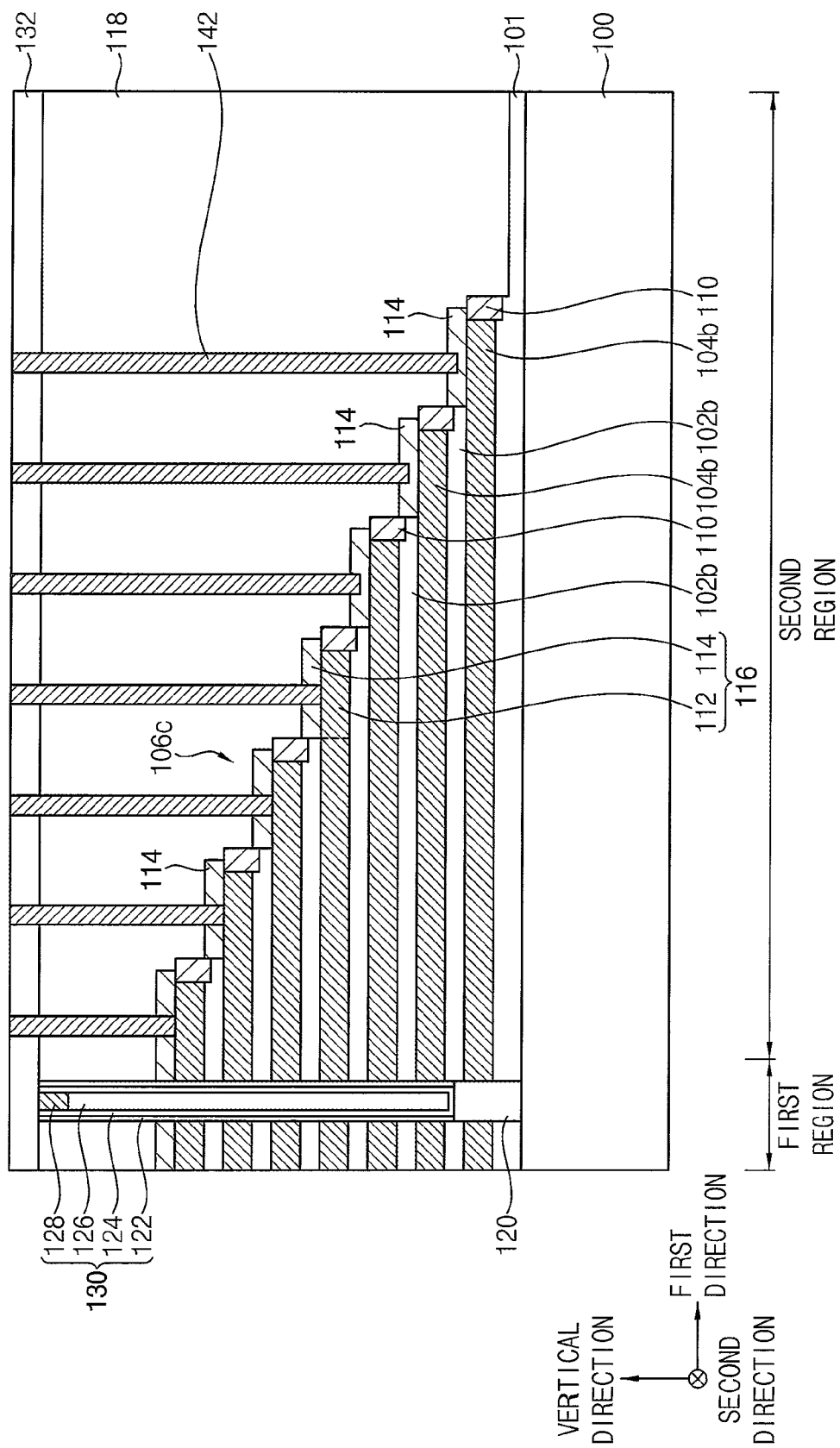
FIGS. 1 and 2 are a cross-sectional view and a plan view of a semiconductor device in accordance with example embodiments.
Figure 2:
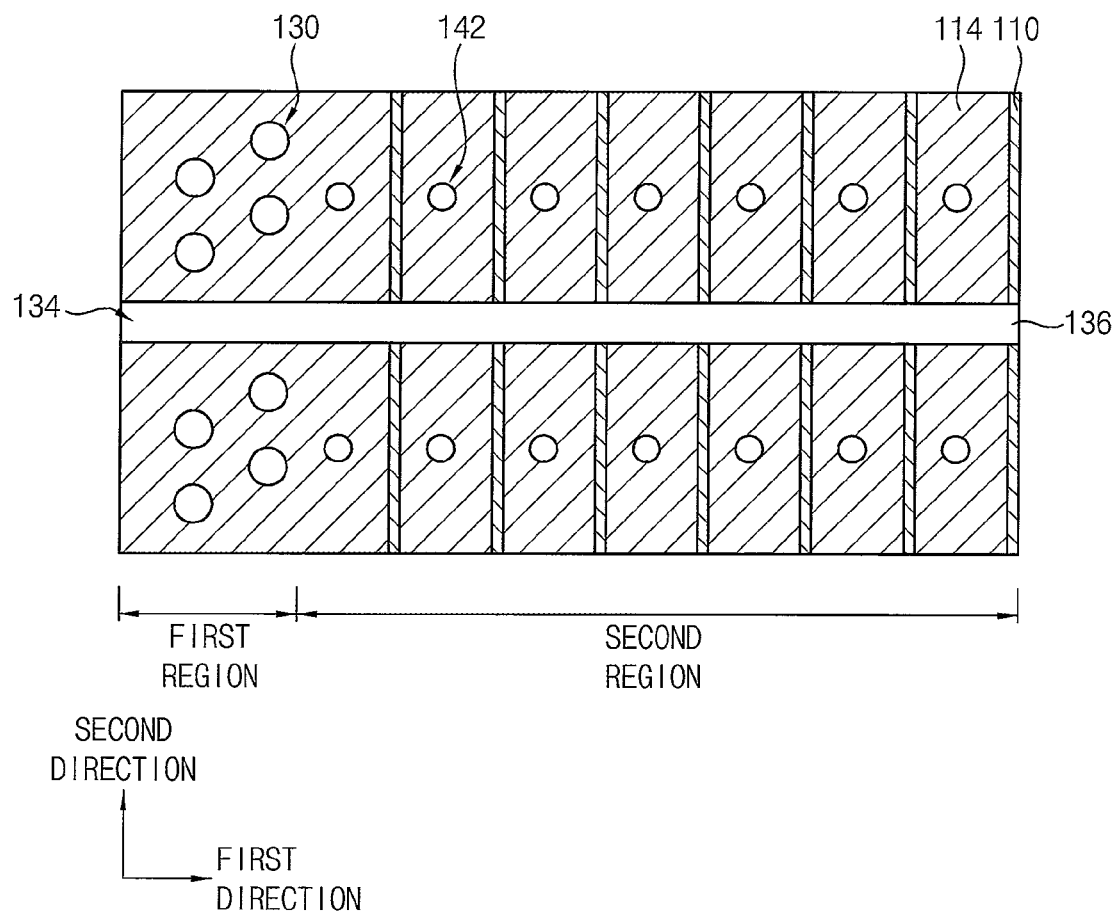
Figure 3:
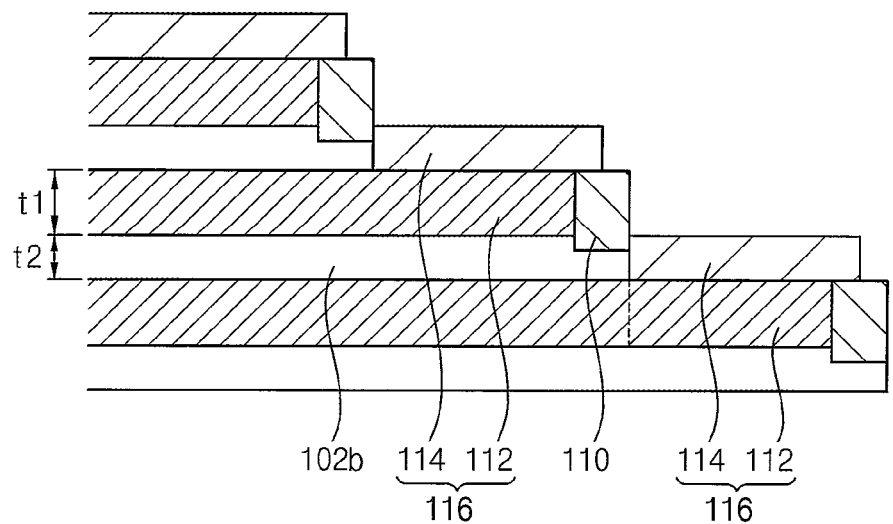
FIG. 3 is a cross-sectional view of a portion of a pad structure in the semiconductor device.

FIGS. 1 and 2 are a cross-sectional view and a plan view of a semiconductor device in accordance with example embodiments. FIG. 3 is a cross-sectional view of a portion of a pad structure in the semiconductor device.

Referring to FIGS. 1 to 3, a substrate 100 may include a first region and a second region. The first region may be a cell region in which memory cells are disposed, and the second region may be a wiring region in which wirings are formed. In an implementation, the second region may be at sides of edges of the first region (e.g., in the first direction). In an implementation, as illustrated in FIGS. 1 and 2, the second region may be at one side of one edge of the first region. In addition, only a portion of the first region may be illustrated in the drawing figures. In an implementation, a width in the first direction of the first region may be greater than a width in the first direction of the second region.

The substrate 100 may include, e.g., a semiconductor material such as silicon or germanium.

A lower insulation layer 101 may be on the substrate 100. A conductive pattern structure 106c may be on the lower insulation layer 101.

The conductive pattern structure 106c may extend from the first region to the second regions. The conductive pattern structure 106c may extend in the first direction horizontal to a surface of the substrate 100.

A plurality of conductive pattern structures 106c may be spaced apart from each other in the second direction. An opening 134 may be between the conductive pattern structures 106c. In an implementation, cell blocks may be divided by the opening 134. In this case, the opening 134 may be between cell blocks.

First, the conductive pattern structure 106c on the first region may be described.

The conductive pattern structure 106c on the first region may include conductive patterns 104b and insulation patterns 102b alternately stacked. In an implementation, the conductive patterns 104b may be spaced apart from each other in the vertical direction from an upper surface of the substrate 100. In an implementation, each of the conductive patterns 104b may have a line or bar shape extending in the first direction.

Upper and lower surfaces (e.g., surfaces facing away from and toward the substrate 100) of the conductive patterns 104b and the insulation patterns 102b may be substantially flat.

In an implementation, the conductive patterns 104b may have a first thickness t1 in the vertical direction. The insulation patterns 102b may have a second thickness t2 in the vertical direction less than the first thickness t1.

The conductive patterns 104b may include a ground selection line (GSL), a string selection line (SSL), and word lines between the ground selection line and the string selection lines.

The conductive patterns 104b may include polysilicon.

Hereinafter, the conductive pattern structure 106c on the second region may be described.

An edge portion or side of the conductive pattern structure 106c on the second region may have a step shape. The conductive pattern structure 106c on the second region may include the insulation patterns 102b, the conductive patterns 104b, upper pad patterns 114, and sidewall insulation patterns 110.

The insulation patterns 102b and conductive patterns 104b of the conductive pattern structure 106c on the second region may be extended from (e.g., may be continuous with) the insulation patterns 102b and conductive patterns 104b of the conductive pattern structure 106c on the first region. In an implementation, the insulation patterns 102b and the conductive patterns 104b on the second region may have the same layered structure as the insulation patterns 102b and conductive patterns 104b on the first region. In an implementation, each of the insulation patterns 102b may be between conductive patterns 104b in the vertical direction, so that the conductive patterns 104b may be spaced apart from each other in the vertical direction by the insulation patterns 102b. The conductive patterns 104b may extend (e.g., lengthwise) in the first direction.

In addition, edges of the insulation patterns 102b and conductive patterns 104b on the second region may have a step shape. The insulation pattern 102b contacting a bottom (e.g., substrate 100-facing side) of one of the conductive patterns 104b may have a length in the first direction greater than a length of the conductive pattern 104b thereon. In an implementation, the insulation pattern 102b contacting the bottom of one of the conductive patterns 104b may protrude in the first direction from or beyond the one of the conductive pattern 104b positioned on the insulation pattern 102b.

In each of the conductive patterns 104b on the second region, a portion that does not overlap with the conductive pattern 104b positioned thereover (e.g., the adjacent conductive pattern 104b that is farther from the substrate 100 in the vertical direction) may be referred to as a step portion. At least a portion of the step portion of each of the conductive patterns 104b may serve as a lower pad pattern 112. In an implementation, in each of the conductive patterns 104b, a portion thereof that does not overlap with the conductive patterns 104b and sidewall insulation patterns 110 positioned thereover may be the lower pad pattern 112.

The sidewall insulation patterns 110 may be on the sidewalls of the conductive patterns 104b, respectively. The sidewall insulation patterns 110 may cover sidewalls of (e.g., each of) the conductive patterns 104b, respectively. The sidewall insulation patterns 110 may be on the insulation patterns 102b, respectively.

The sidewall insulation patterns 110 may include an insulation material having a (e.g., high) etch selectivity (e.g., may be etched at a different rate under like etching conditions) with respect to the conductive patterns 104b and the insulation patterns 102b. In an implementation, the sidewall insulation patterns 110 may include, e.g., a nitride such as silicon nitride.

In an implementation, an upper surface (e.g., surface facing away from the substrate 100 in the vertical direction) of the sidewall insulation pattern 110 and an upper surface of the lower pad pattern 112 may be substantially coplanar with each other. In an implementation, a lower (e.g., substrate 100-facing) surface of the sidewall insulation pattern 110 may be may be substantially coplanar with a lower surface of the lower pad pattern 112, or the lower surface of the sidewall insulation pattern 110 may be lower than (e.g., closer to the substrate 100 in the third direction than) the lower surface of the lower pad pattern 112.

The upper pad pattern 114 may cover at least an entire upper surface of the lower pad pattern 112. In an implementation, the upper pad pattern 114 may be on the upper surfaces of the lower pad pattern 112 and a portion of the sidewall insulation pattern 110. In an implementation, an end portion of the upper pad pattern 114 may protrude in the first direction from or beyond an end portion of the lower pad pattern 112 thereunder. In an implementation, the end portion of the upper pad pattern 114 may not protrude in the first direction from or beyond an end portion of the sidewall insulation pattern 110 thereunder.

The upper pad pattern 114 may include silicon. In an implementation, the upper pad pattern 114 may include polysilicon. The upper pad pattern 114 may include the silicon formed by an epitaxial growth from the lower pad pattern 112.

In an implementation, the upper surface of the upper pad pattern 114 may be lower (e.g., closer to the substrate 100 in the vertical direction) than the upper surface of the sidewall insulation pattern 110 positioned over one level of the upper pad pattern 114. In an implementation, a thickness (in the vertical direction) of the upper pad pattern 114 may be less than a thickness of a structure in which one of the conductive patterns 104b and one of the insulation patterns 102b are stacked. If the thickness of an upper pad pattern were to be greater than the structure in which one of the conductive pattern and one of the insulation pattern are stacked, a bridge failure between neighboring upper pad patterns could occur.

A structure in which one of the lower pad patterns 112 and one of the upper pad patterns 114 are stacked may serve as a pad structure 116. A contact plug 142 may be on the pad structure 116. A vertical thickness of the pad structure 116 may be greater than the first thickness t1 of one of the conductive patterns 104b.

In an implementation, the upper pad pattern 114 may be formed on an uppermost conductive pattern 104b in the conductive pattern structure 106c. In an implementation, the upper pad pattern 114 on or at a top of the conductive pattern structure 106c (e.g., farthest from the substrate 100 in the vertical direction) may be formed on the first and second regions.

A first insulating interlayer 118 may cover the conductive pattern structure 106c. An upper surface of the first insulating interlayer 118 may be substantially flat. The first insulating interlayer 118 may include silicon oxide.

A channel structure 130 may pass through the conductive pattern structure 106c and the first insulating interlayer 118 on the first region, and the channel structure 130 may be electrically connected to the substrate 100.

In an implementation, a semiconductor pattern 120 may be further formed between the substrate 100 and the channel structure 130. The semiconductor pattern 120 may include, e.g., single crystalline silicon or polysilicon.

The channel structure 130 may include a dielectric layer structure 122, a channel 124, a buried insulation pattern 126, and an upper conductive pattern 128. The channel 124 may have a hollow cylinder shape or a cup-like shape. The channel 124 may include polysilicon or single crystalline silicon. The buried insulation pattern 126 may fill an inner space of the channel 124. The dielectric layer structure 122 may surround an outer wall of the channel 124. The dielectric layer structure 122 may include a tunnel insulation layer, a charge storage layer, and a blocking layer sequentially stacked on the outer wall of the channel 124. The upper conductive pattern 128 may be formed on the buried insulation pattern 126, and the upper conductive pattern 128 may be electrically connected to the channel 124.

A second insulating interlayer 132 may be formed on the first insulating interlayer 118. The first and second insulating interlayers 118 and 132 may include the same material, so that the first and second insulating interlayers 118 and 132 may be merged into one insulating interlayer.

In an implementation, a second insulation pattern 136 may fill the opening 134 between the conductive pattern structures 106c. In an implementation, a common source line may be formed through the second insulation pattern 136 in the opening 134, and the common source line may be connected to the substrate 100. The common source line may be spaced apart from the conductive patterns 104b by the second insulation pattern 136.

The contact plugs 142 may pass through the first and second insulating interlayers 118 and 132, so that the contact plugs 142 may contact the pad structures 116, respectively. In an implementation, the contact plugs 142 may be electrically connected to the conductive patterns 104b, respectively. In an implementation, the contact plug 142 may include a barrier metal pattern and a metal pattern.

The contact plugs 142 may contact the upper pad patterns 114, respectively. A bottom of the contact plug 142 may be at an upper surface or an inner portion of a stacked structure including the upper pad pattern 114 and the lower pad pattern 112 stacked. In an implementation, the bottom of the contact plug 142 may be at the upper surface or an inner portion of the pad structure 116. In an implementation, the bottom of the contact plug 142 contacting the pad structure 116 relatively positioned at an upper step (e.g., a step distal to the substrate 100 in the vertical direction) may be at a lower inner portion of pad structure 116 (e.g., may penetrate deeper in the pad structure 116). The bottom of the contact plug 142 contacting the pad structure 116 relatively positioned at a lower step (e.g., a step proximate to the substrate 100 in the vertical direction) may be at an upper inner portion or the upper surface of pad structure 116 (e.g., may penetrate shallower in the pad structure 116).

In an implementation, a thickness of a portion (e.g., of a pad or connection structure)) where the bottom of the contact plug 142 is positioned may be increased, so that a process margin for forming the contact plug 142 may be increased. In an implementation, defects of the contact plug 142 may be decreased. In an implementation, non-contact (e.g., a disconnect) between the contact plug 142 and the pad structure 116 or a punching defect (in which the contact plug 142 extends into a conductive pattern below a target pad structure) may be decreased.

A wiring line electrically connected to an upper surface of the contact plug 142 may be further formed on the second insulating interlayer 132. In an implementation, the wiring line may have a line shape extending in the second direction. Wiring lines electrically connected to the channel structures 130 may be further formed on the second insulating interlayer 132.

FIGS. 4 to 15 are cross-sectional views and plan views of stages in a method of manufacturing a semiconductor device in accordance with example embodiments.

FIGS. 4 to 6, 8, 9, 11, 13 and 15 are cross-sectional views, and FIGS. 7, 10, 12 and 14 are plan views.

Figure 4:
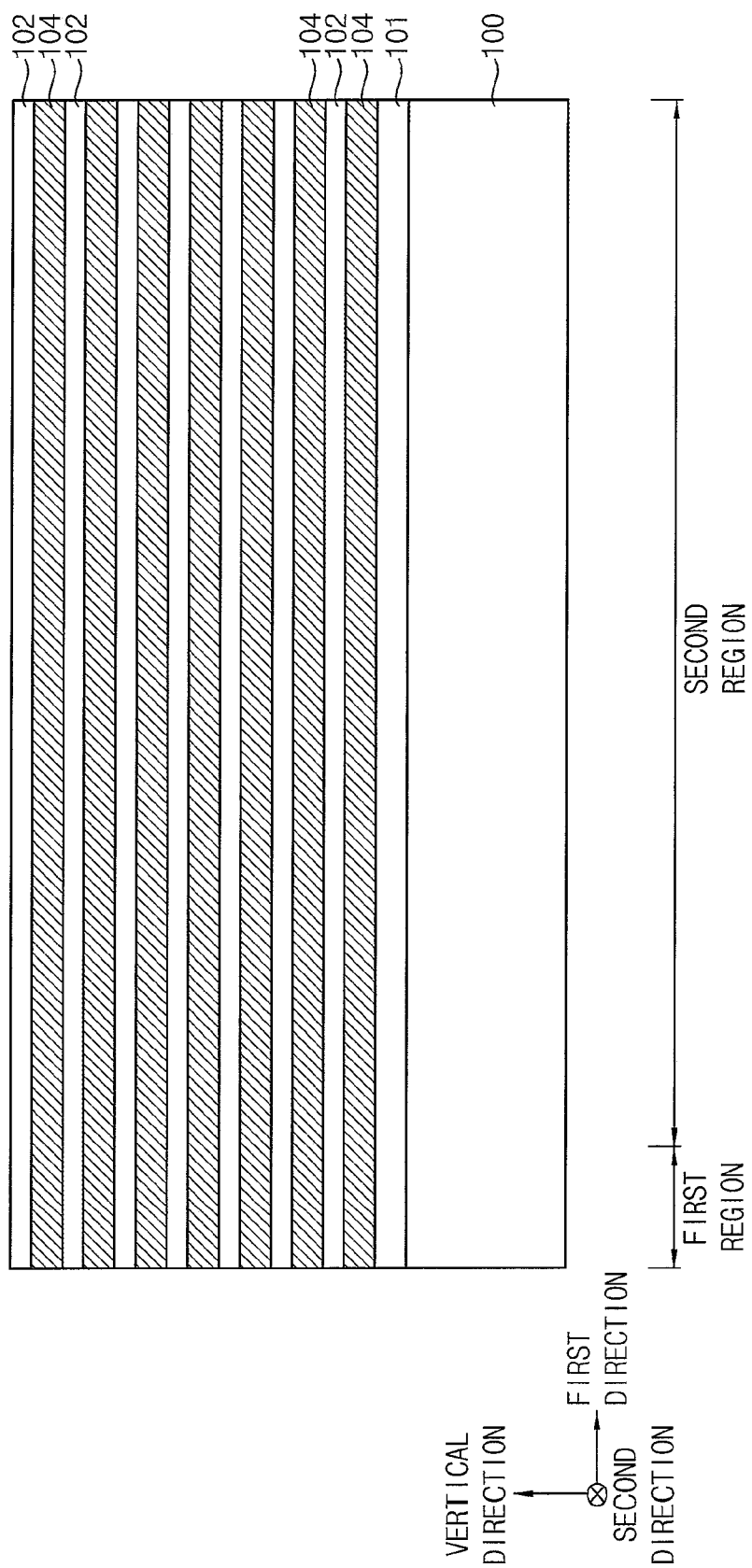
FIGS. 4 to 15 are cross-sectional views and plan views of stages in a method of manufacturing a semiconductor device in accordance with example embodiments.

Referring to FIG. 4, a lower insulation layer 101 may be formed on a substrate 100 including first and second regions. First conductive layers 104 and insulation layers 102 may be alternately and repeatedly formed on the lower insulation layer 101 to form a stacked structure. In an implementation, the lower insulation layer 101 and the insulation layers 102 may be formed of an oxide such as silicon oxide, silicon carbonate, or silicon oxyfluoride. In an implementation, the first conductive layers 104 may be formed of polysilicon.

In an implementation, the lower insulation layer 101 directly contacting the substrate 100 may have a vertical thickness greater than a vertical thickness of each of the insulation layers 102 thereunder. In an implementation, each of the insulation layers 102 may have a thickness less than a thickness of each of the first conductive layers 104. As the thickness of each of the insulation layers 102 is reduced, a height of the stacked structure may be reduced.

Figure 5:
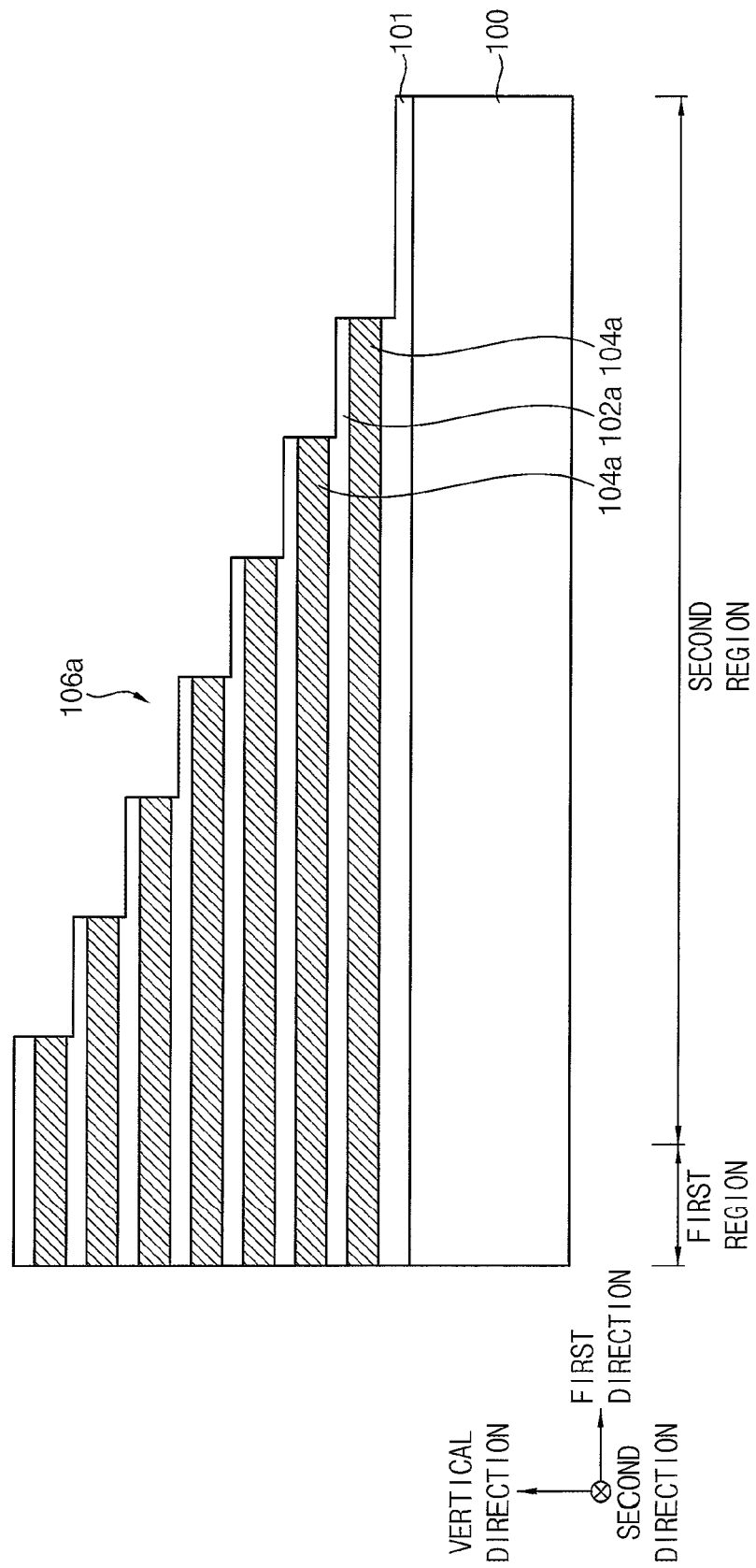

Referring to FIG. 5, portions of the insulation layers 102 and the first conductive layers 104 may be etched to form a first preliminary conductive pattern structure 106a having a step shape at an edge portion. The first preliminary conductive pattern structure 106a may include preliminary conductive patterns 104a and preliminary insulation patterns 102a alternately stacked. The lower insulation layer 101 may remain on the surface of the substrate 100 by a predetermined thickness, so that the surface of the substrate 100 may be covered with the lower insulation layer 101. In an implementation, the surface of the substrate 100 adjacent to the first preliminary conductive pattern structure 106a may not be exposed.

In an implementation, the edge portion of the first preliminary conductive pattern structure 106a may have a step shape (e.g., stepping downward in the first direction). In an implementation, the edge portion of the first preliminary conductive pattern structure 106a may have a step shape (e.g., stepping downward) in each of the first direction and the second direction.

An upper surface of the preliminary insulation pattern 102a may be exposed at the step portion of the first preliminary conductive pattern structure 106a. In an implementation, the preliminary insulation pattern 102a at the step portion may have a thickness that is less than the thickness of the insulation layer 102 as deposited. In an implementation, the preliminary insulation pattern 102a positioned at the step portion may have a thickness that is substantially the same as the thickness as the insulation layer 102 as deposited.

Figure 6:
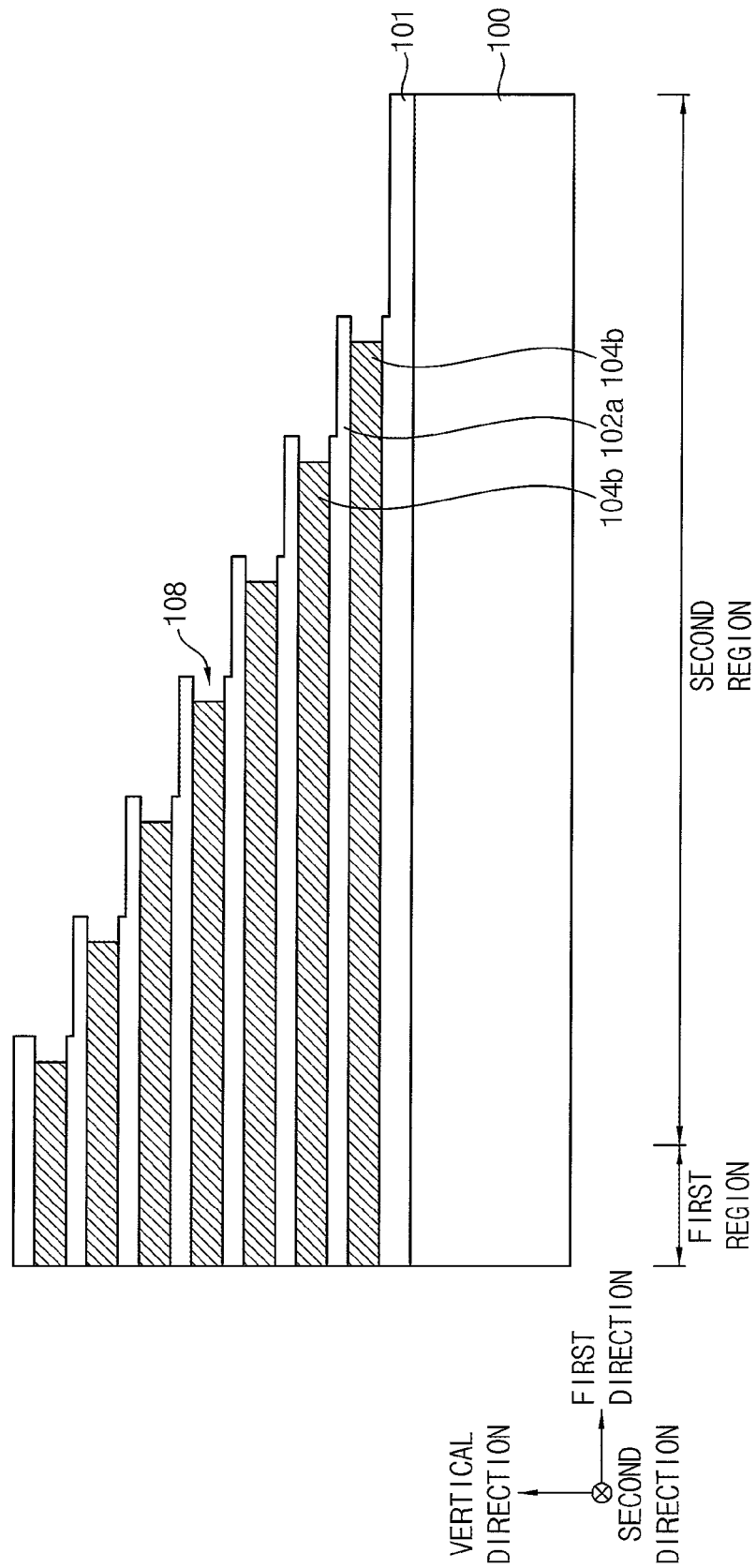
Figure 7:
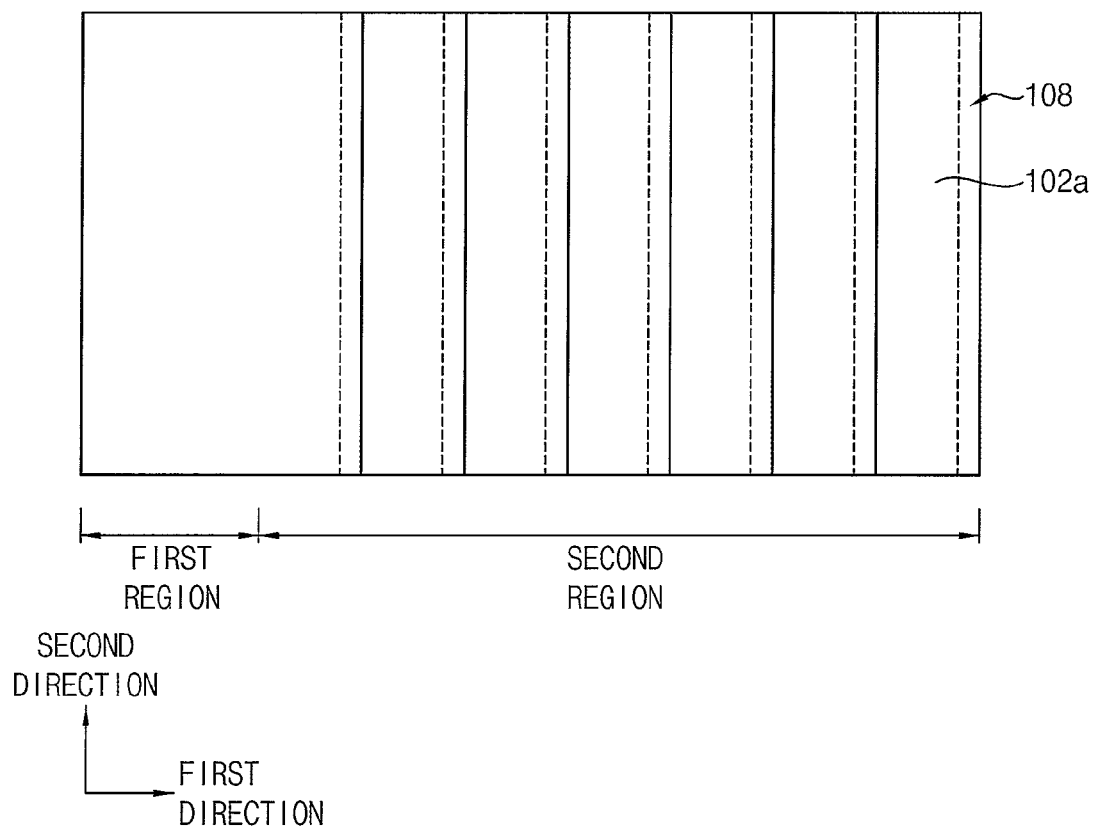

Referring to FIGS. 6 and 7, the preliminary conductive pattern 104a exposed by a sidewall of the first preliminary conductive pattern structure 106a may be partially etched to form a conductive pattern 104b. In an implementation, an undercut portion 108 defined by the conductive pattern 104b and the preliminary insulation patterns 102a positioned on and beneath of the conductive pattern 104b may be formed by the etching process.

The etching process may include an isotropic etching process. In an implementation, the isotropic etching process may include a wet etching process or an isotropic dry etching process.

In an implementation, a width (in the first direction) of the undercut portion 108 may be about 200 Å to about 500 Å. In order to increase the width in the first direction of the undercut portion, a length (in the first direction) of the preliminary conductive pattern 104a may be increased. Thus, a width in the first direction of the first preliminary conductive pattern structure 106a may be increased. Maintaining the width in the first direction of the undercut portion 108 at about 200 Å or greater may help prevent a bridge failure between the pad patterns in a subsequent process. In an implementation, the width in the first direction of the undercut portion 108 may be about 200 Å to about 300 Å.

Figure 8:
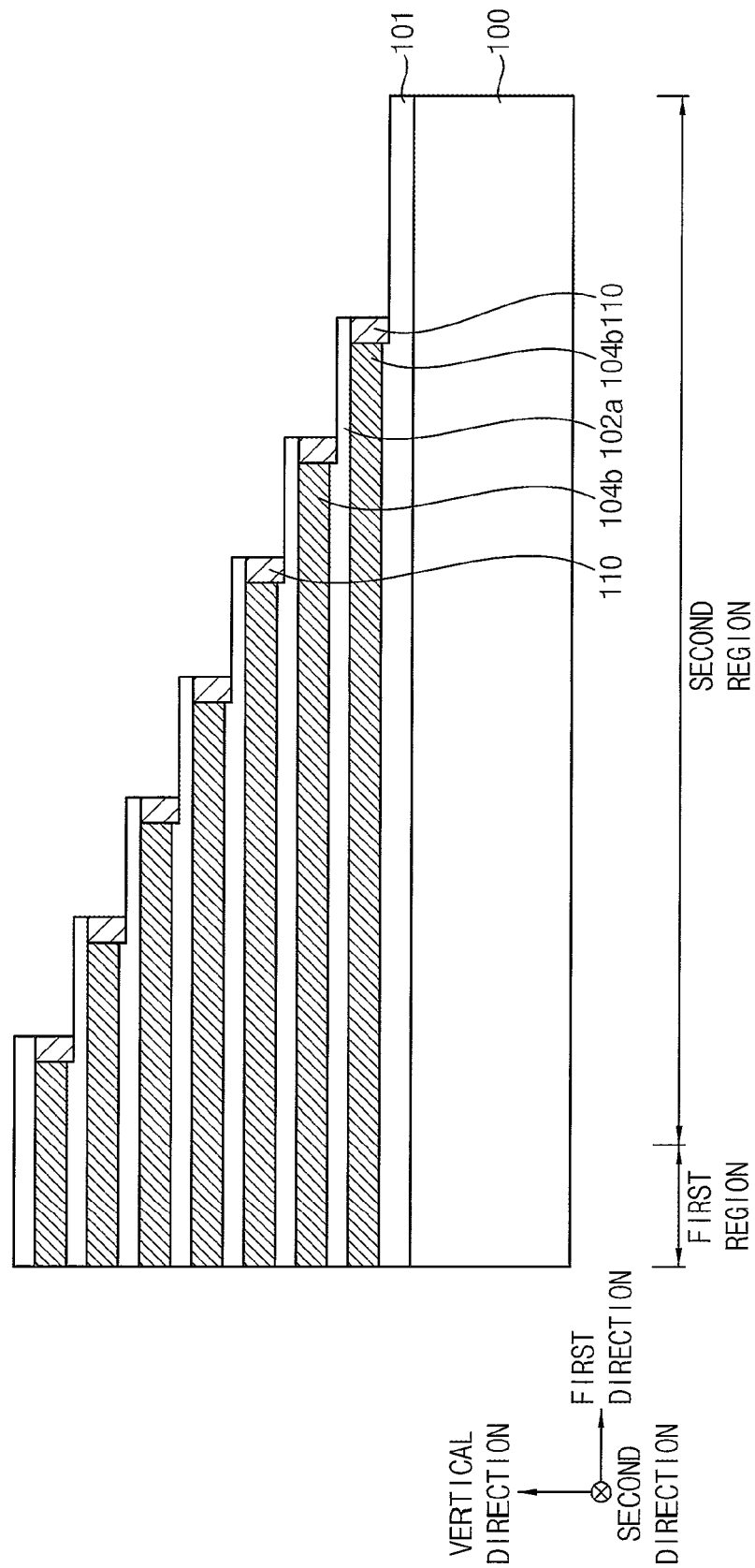

Referring to FIG. 8, a sidewall insulation pattern 110 may be formed to fill the undercut portion 108.

In an implementation, the insulation layer may be conformally formed on a surface of the first preliminary conductive pattern structure 106a to fill the undercut portion 108. Thereafter, the insulation layer may be anisotropically etched to form the sidewall insulation pattern 110.

The sidewall insulation pattern 110 may include an insulation material having a high etch selectivity with respect to the conductive pattern 104b and the preliminary insulation pattern 102a. In an implementation, the sidewall insulation pattern 110 may be formed of a nitride such as silicon nitride.

Figure 9:
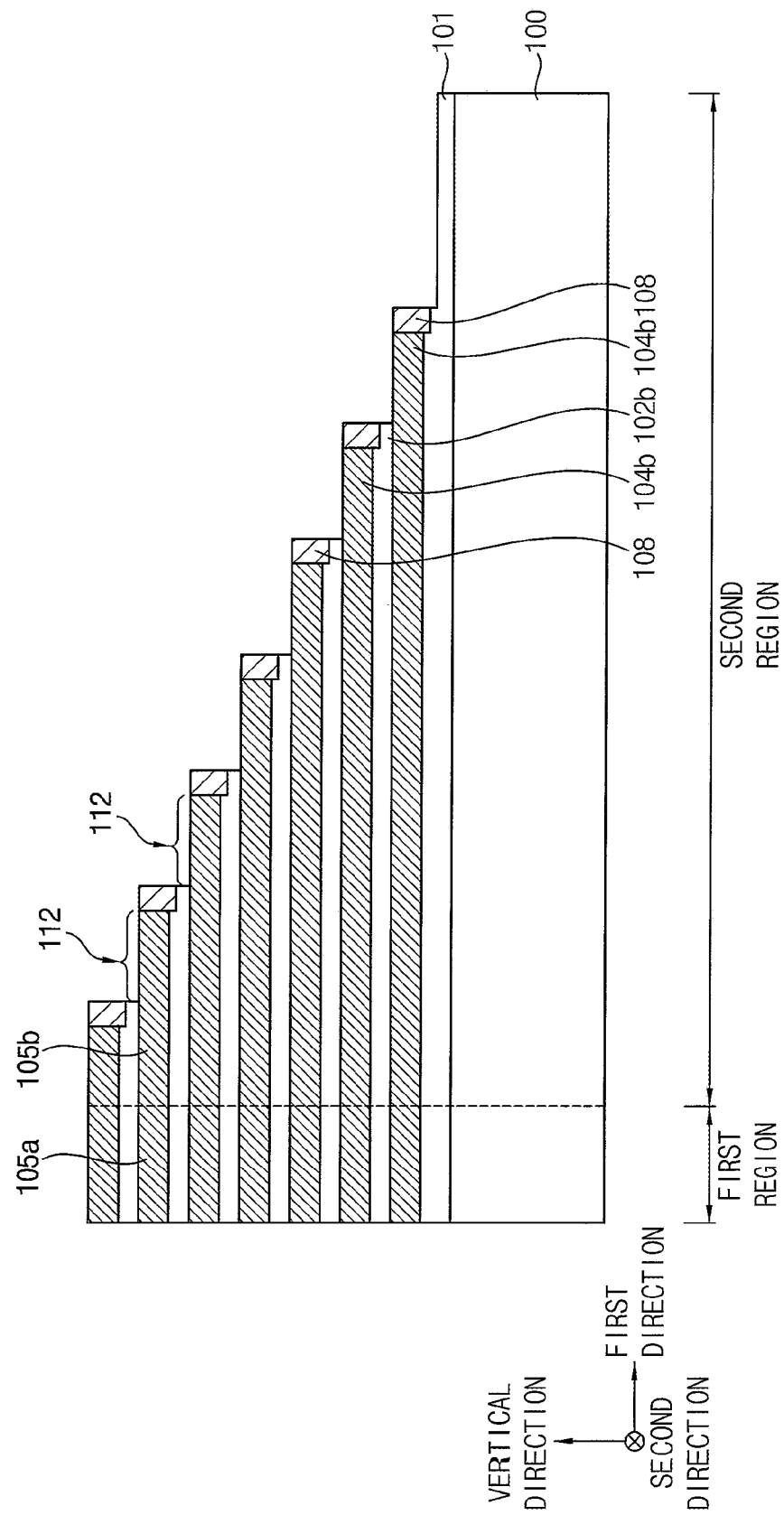
Figure 10:
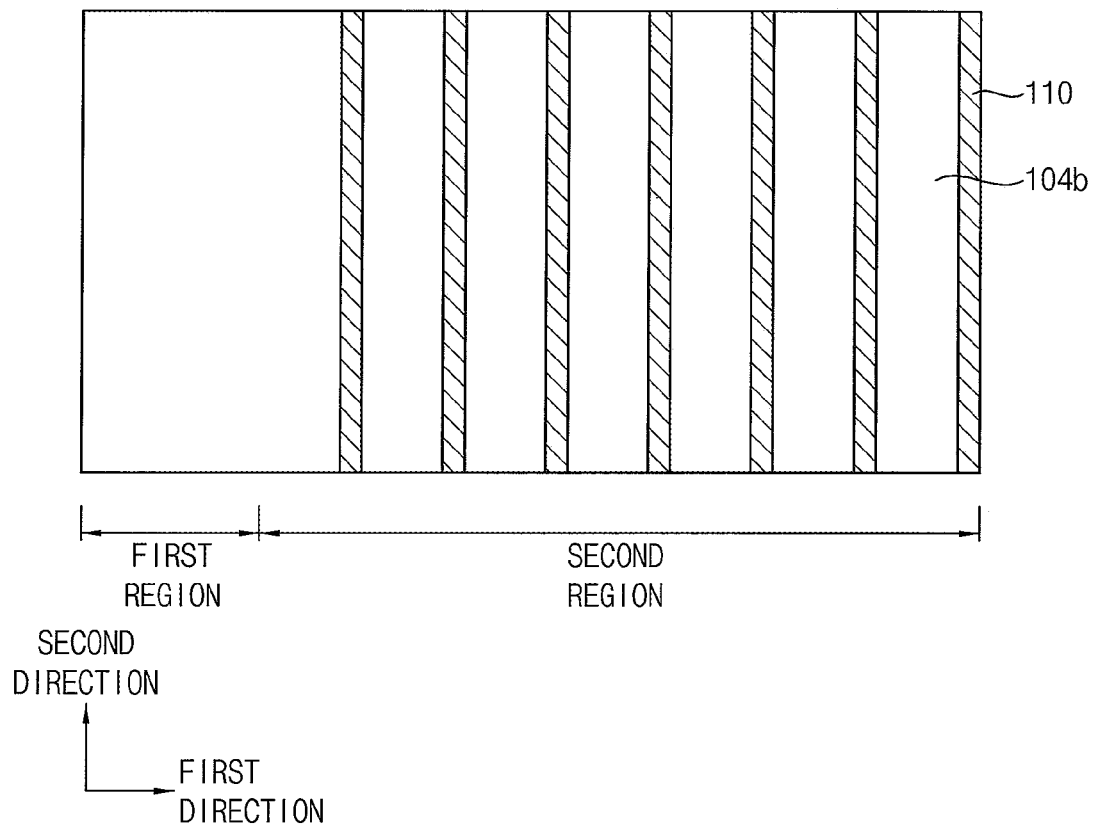

Referring to FIGS. 9 and 10, the preliminary insulation pattern 102a on the step portion of the first preliminary conductive pattern structure 106a may be etched to form an insulation pattern 102b. By the etching process, an upper surface of the step portion of the conductive pattern 104b and an upper surface of the sidewall insulation pattern 110 may be exposed. The etching process may include an anisotropic etching process. The sidewall insulation pattern 110 may be formed on a sidewall of the conductive pattern 104b.

In an implementation, sidewalls of the sidewall insulation pattern 110 and sidewalls of the insulation pattern 102b may correspond to a sidewall of the step portion of the first preliminary conductive pattern structure 106a. In an implementation, the upper surfaces of the conductive pattern 104b and the sidewall insulation pattern 110 may be exposed at the step portion of the first preliminary conductive pattern structure 106a.

The lower insulation layer 101 contacting the surface of the substrate 100 may remain a predetermined thickness, after the etching processes. In an implementation, the surface of the substrate 100 may be covered with the lower insulation layer 101.

In the first preliminary conductive pattern structure 106a, a conductive pattern 104b on the first region may serve as a gate pattern, and a conductive pattern 104b on the second region may be connected to the gate pattern. In an implementation, in the conductive pattern 104b on the second region, an exposed step portion may serve as a lower pad pattern 112.

Figure 11:
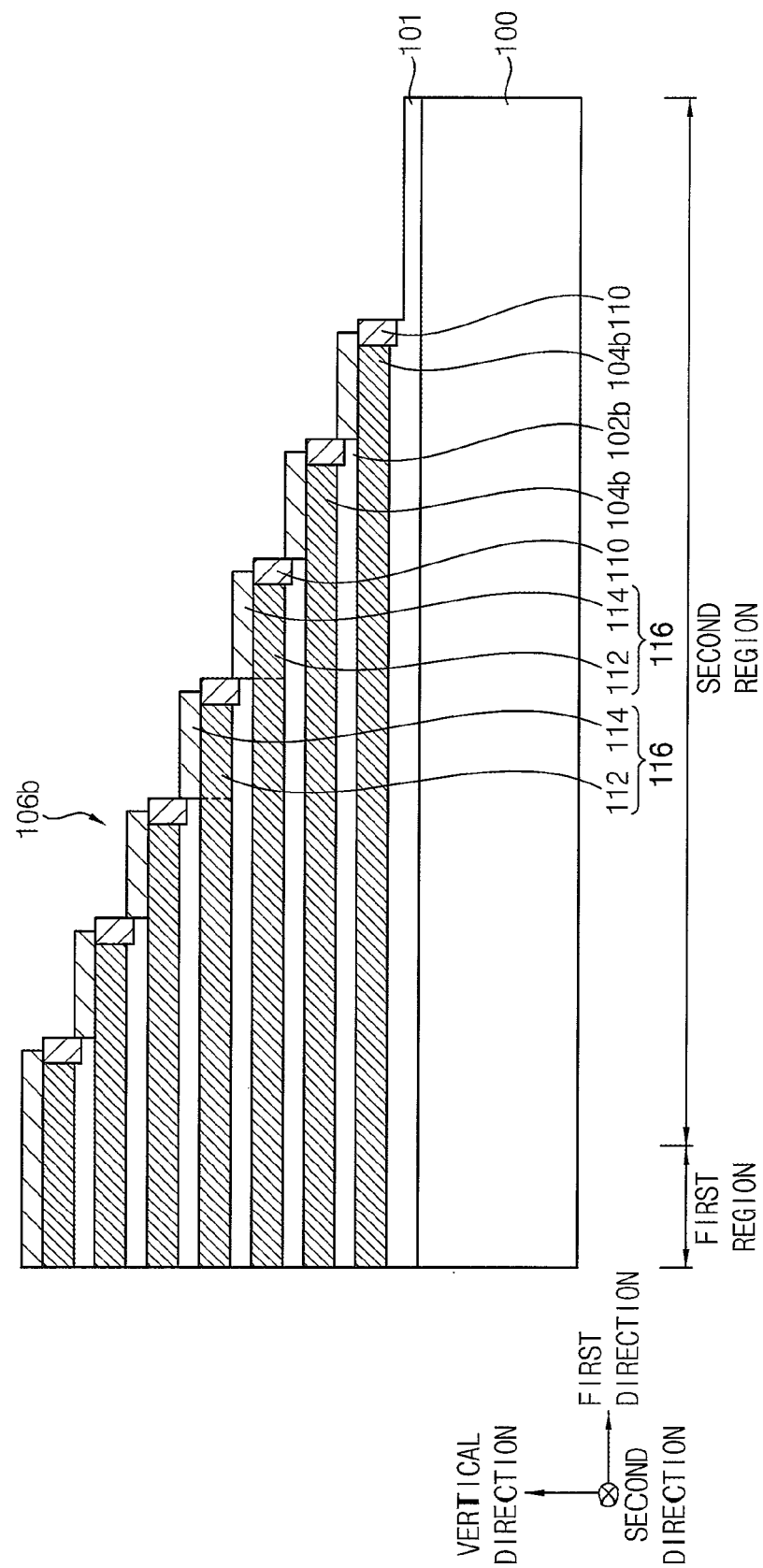
Figure 12:
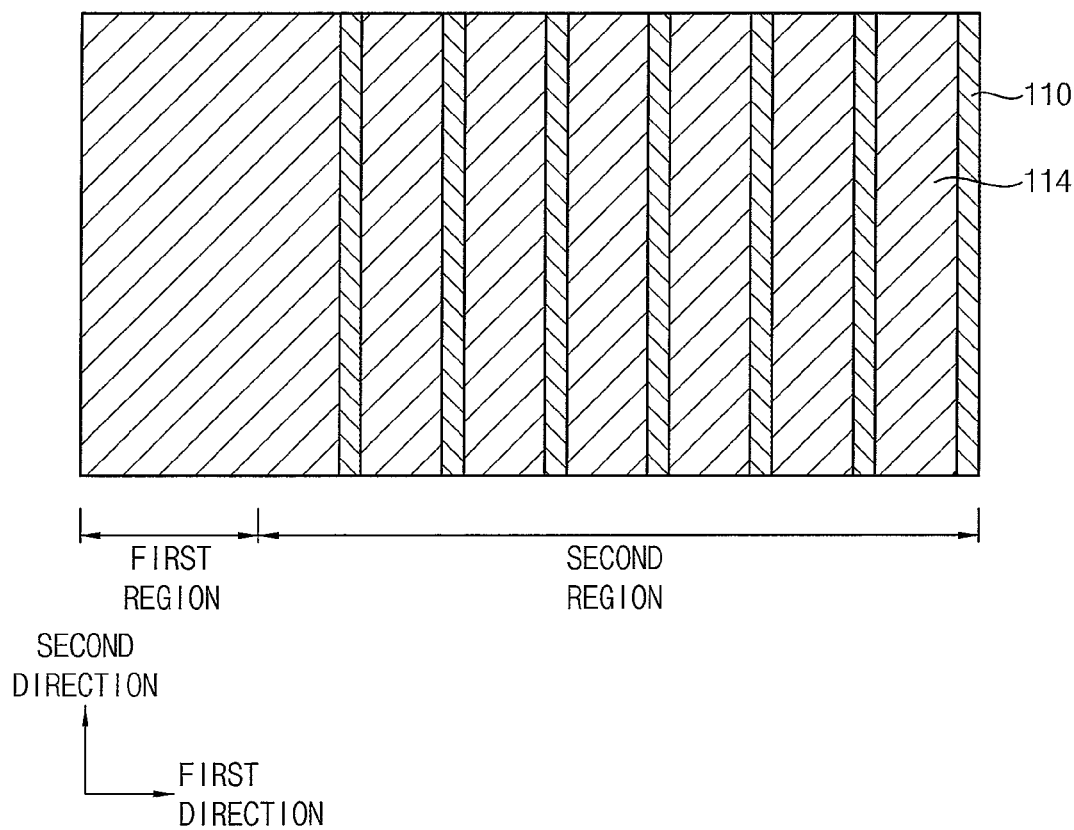

Referring to FIGS. 11 and 12, an upper pad pattern 114 may be formed on the lower pad pattern 112 by a selective epitaxial growth process. The upper pad pattern 114 may be formed by growing silicon using the lower pad pattern 112 (including polysilicon) as a seed. In an implementation, the upper pad pattern 114 may include polysilicon. In an implementation, a second preliminary conductive pattern structure 106b may be formed.

When the selective epitaxial growth process is performed, the upper pad pattern 114 may be grown in a vertical direction and a lateral direction. In an implementation, the upper pad pattern 114 may be formed on an upper surface of the lower pad pattern 112 and a portion of an upper surface of the sidewall insulation pattern 110.

An upper surface of the upper pad pattern 114 may be lower than the upper surface of the sidewall insulation pattern 110 positioned over one level of the upper pad pattern 114 (e.g., may be lower than the upper surface of the sidewall insulation pattern 110 laterally adjacent thereto in the first direction). When the upper surface of the upper pad pattern 114 is higher than the upper surface of the sidewall insulation pattern 110 positioned over one level, the upper pad pattern 114 and the lower pad pattern 112 positioned thereover one level may contact each other.

A structure in which one of the lower pad patterns 112 and one of the upper pad patterns 114 are stacked may serve as a pad structure 116.

In an implementation, the upper pad pattern 114 may be formed on an uppermost conductive pattern 104b (e.g., farthest from the substrate 100 in the vertical direction) in the second preliminary conductive pattern structure 106b. In an implementation, the conductive pattern 104b and the upper pad pattern 114 may be stacked on a top of the second preliminary conductive pattern structure 106b in the first and second regions.

Figure 13:
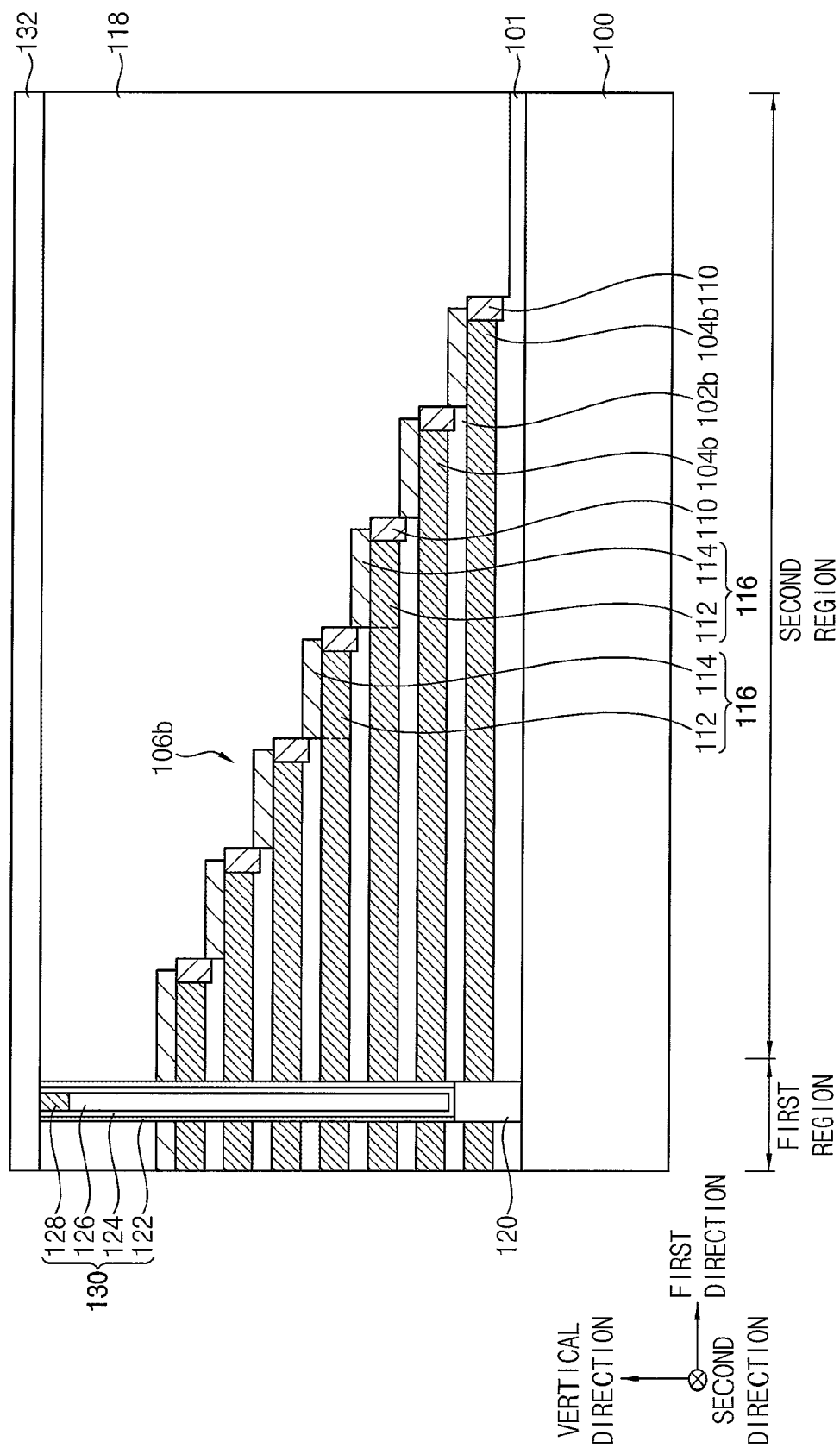
Figure 14:
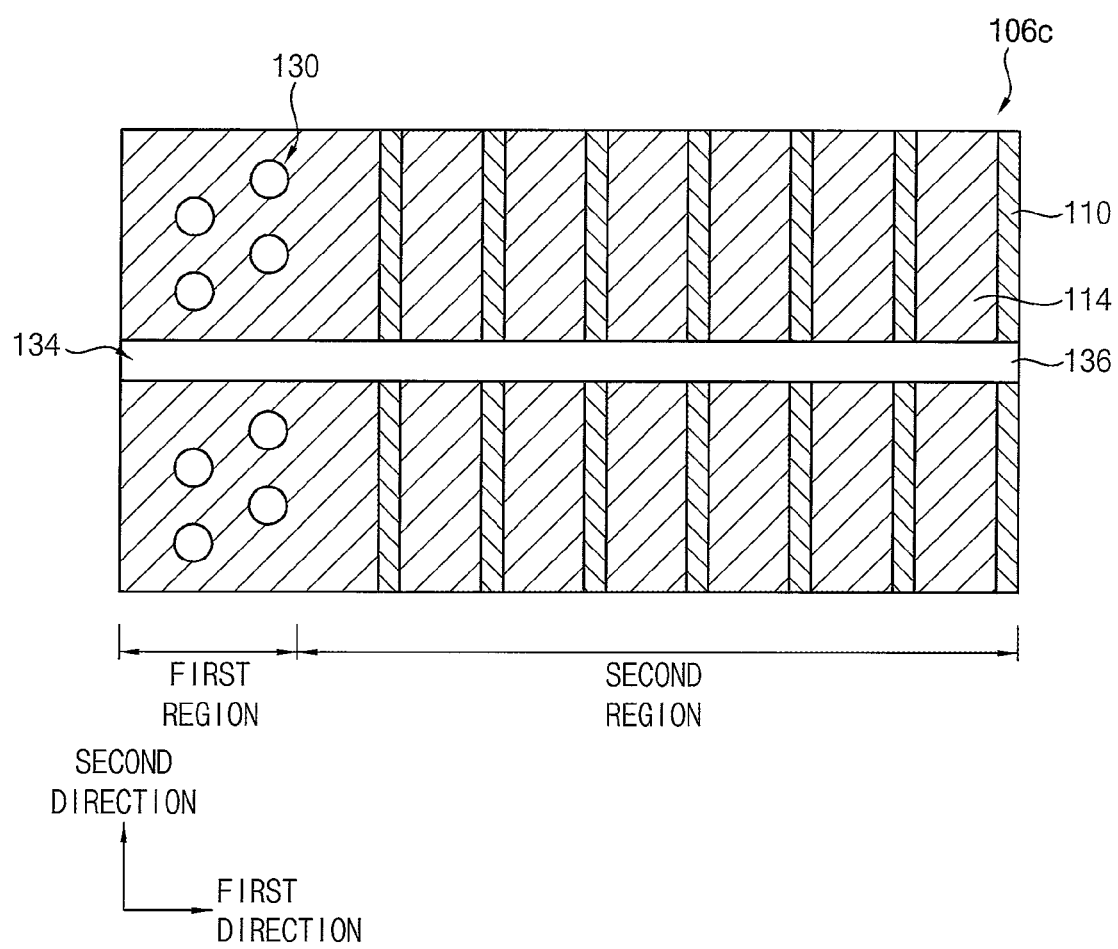

Referring to FIGS. 13 and 14, a first insulating interlayer 118 may be formed to cover the second preliminary conductive pattern structure 106b.

In an implementation, an oxide layer such as silicon oxide, silicon carbonate, or silicon oxyfluoride may be formed on the second preliminary conductive pattern structure 106b, and an upper surface of the oxide layer may be planarized to form the first insulating interlayer 118. The planarization process may include a chemical mechanical polishing (CMP) process and/or an etchback process.

Thereafter, channel holes exposing the surface of the substrate 100 may be formed through the second preliminary conductive pattern structure 106b and the first insulating interlayer 118 in the first region. Channel structures 130 may be formed in the channel holes, respectively. In an implementation, a semiconductor pattern 120 contacting the substrate 100 may be further formed under each of the channel structures 130.

In an implementation, a selective epitaxial growth process may be performed on the substrate 100 exposed by the channel hole to form the semiconductor pattern 120. The channel structure 130 including a dielectric layer structure 122, a channel 124, a buried insulation pattern 126, and an upper conductive pattern 128 may be formed on the semiconductor pattern 120.

A second insulating interlayer 132 may be formed on the first insulating interlayer 118 to cover the channel structures 130.

The second preliminary conductive pattern structure 106b, and the first and second insulating interlayers 118 and 132 may be anisotropically etched to form an opening 134 extending lengthwise in the first direction. In an implementation, cell blocks of the semiconductor device may be separated by the opening 134.

In an implementation, a second insulation pattern 136 may be formed to fill the opening 134. In an implementation, a common source line connected to the substrate may be formed through the second insulation pattern 136 in the opening 134. The common source line may be spaced apart from the conductive patterns 104b by the second insulation pattern 136.

In an implementation, the second preliminary conductive pattern structures 106b may be separated from each other, so that conductive pattern structures 106c may be formed at sides of the opening 134. The conductive pattern structure 106c may extend in the first direction. The surface of the substrate 100 may be exposed by a bottom of the opening 134.

The conductive pattern structure 106c on the first region may include the insulation patterns 102b and conductive patterns 104b. The conductive pattern structure 106c on the second region may include insulation patterns 102b, conductive patterns 104b, the upper pad patterns 114, and the sidewall insulation patterns 110.

Figure 15:
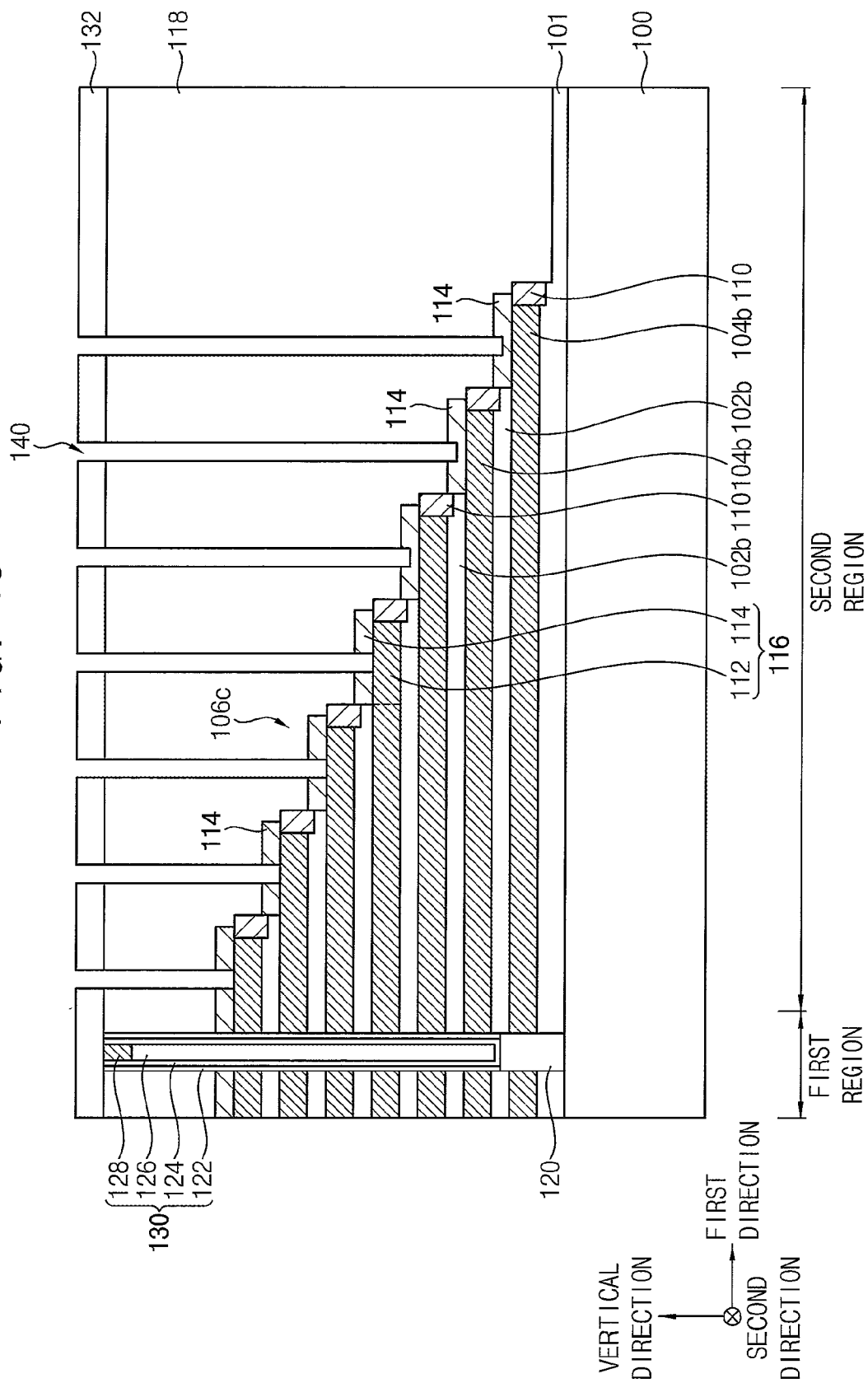

Referring to FIG. 15, the first and second insulating interlayers 118 and 132 may be etched to form contact holes 140 exposing the pad structures 116, respectively. In an implementation, a bottom of each of the contact holes 140 may expose the lower pad pattern 112 or the upper pad pattern 114.

In an implementation, the pad structures 116 have a step shape, and vertical heights of the upper surfaces of the pad structures 116 (e.g., relative to the substrate 100) may be different from one another. In an implementation, in the etching process, the contact hole 140 may already be formed on the pad structure 116 positioned at an upper level before forming the contact hole 140 on the pad structure 116 positioned at a lower level. In the etching process, the pad structure 116 positioned at the upper level may be over etched. In an implementation, the pad structure 116 may include the stacked lower pad pattern 112 and upper pad pattern 114, and the pad structure 116 may have a sufficient thickness. In an implementation, a punching defect in which the bottom of the contact hole 140 extends below or through a lower surface of the lower pad pattern by the over etching may be decreased.

Referring again to FIGS. 1 and 2, a conductive material may be formed in the contact holes 140 to form contact plugs 142.

In an implementation, a barrier metal layer may be conformally formed on surfaces of the contact holes 140 and the second insulating interlayer 132, and a metal layer may be formed on the barrier metal layer. The metal layer and the barrier metal layer may be planarized until an upper surface of the second insulating interlayer 132 may be exposed to form the contact plugs 142.

Wiring lines electrically connected to an upper surface of the contact plug 142 may be further formed on the second insulating interlayer 132. In addition, wiring lines electrically connected to the channel structure 130 may be further formed on the second insulating interlayer 132.

Figure 16:
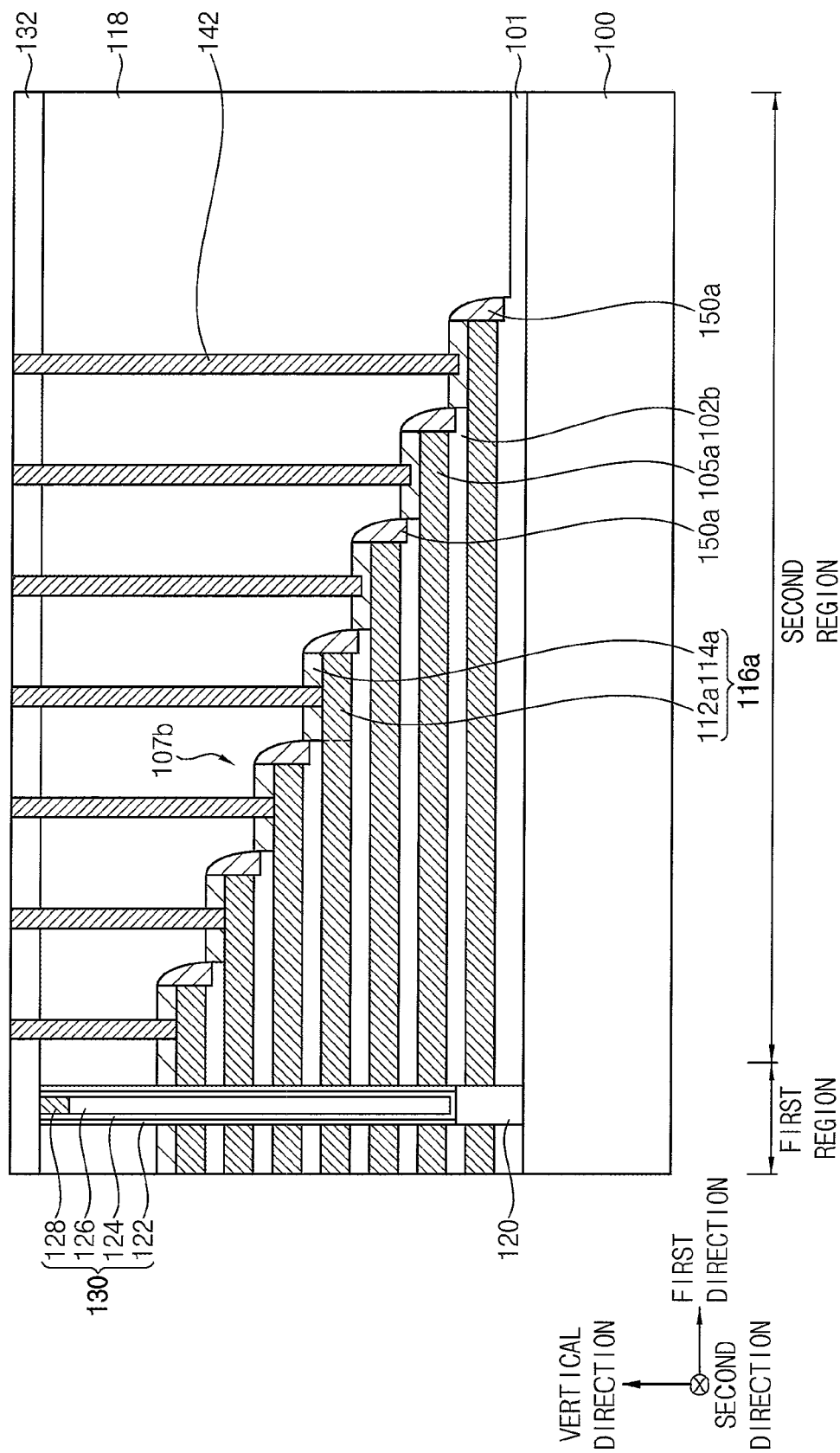
FIGS. 16 and 17 are a cross-sectional view and a plan view of a semiconductor device in accordance with example embodiments.
Figure 17:
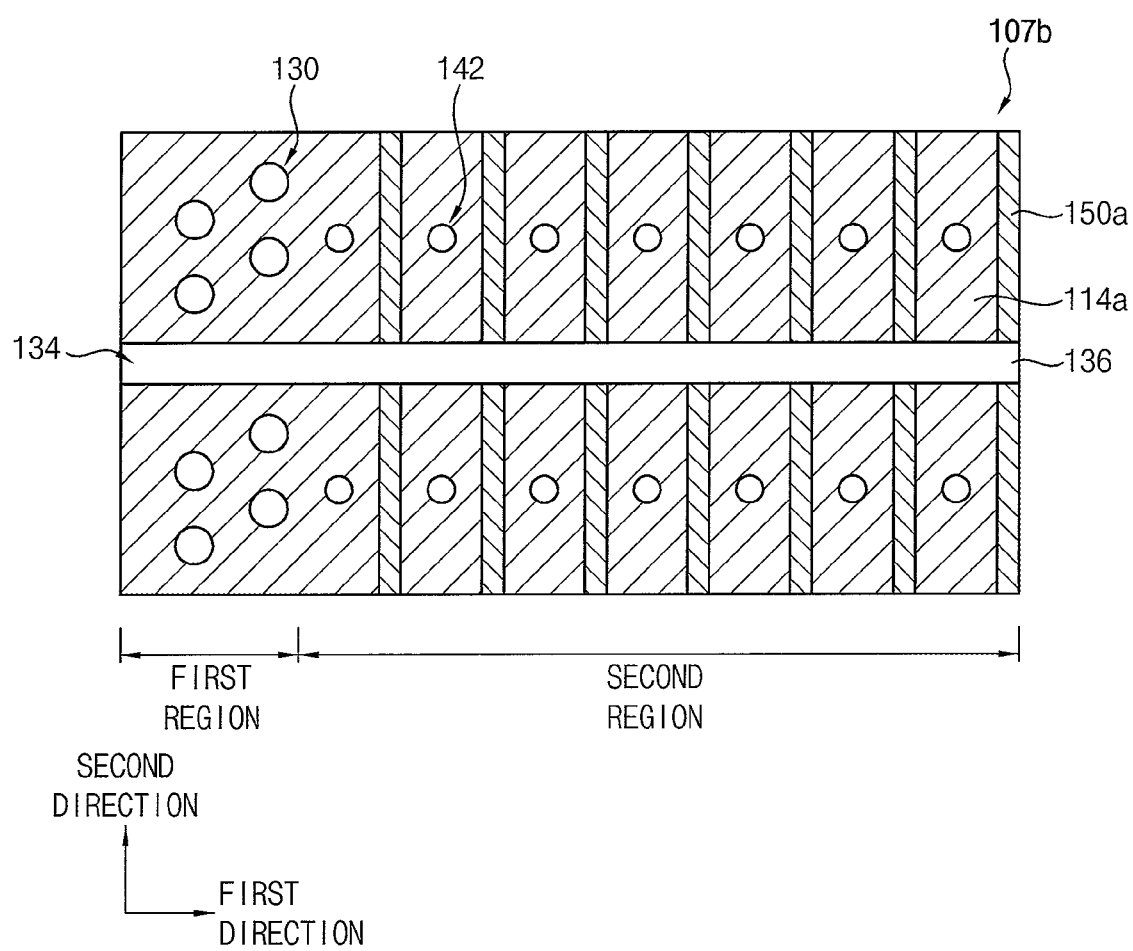

FIGS. 16 and 17 are a cross-sectional view and a plan view of a semiconductor device in accordance with example embodiments.

The semiconductor device is substantially the same as the semiconductor device described with reference to FIGS. 1 to 3, except for a shape of the conductive pattern structure on the second region. Therefore, duplicate descriptions may be omitted or only briefly described.

Referring to FIGS. 16 and 17, an edge portion of the conductive pattern structure 107b in the second region may have a step shape. The conductive pattern structure 107b on the second region may include the insulation patterns 102b, the conductive patterns 105a, the upper pad patterns 114a, and the sidewall insulation patterns 150a. The insulation patterns 102b and the conductive patterns 105a in the conductive pattern structure 107b on the second region may extend from the insulation patterns 102b and the conductive patterns 105a in the conductive pattern structure 107b on the first region.

Edge portions of the insulation patterns 102b and the conductive patterns 105a on the second region may have a step shape. A step portion of each of the conductive patterns 105a may serve as a lower pad pattern 112a. In an implementation, in each of the conductive patterns 105a, a portion that does not overlap with the conductive patterns 104b and sidewall insulation patterns 110 positioned over may be the lower pad pattern 112a.

The sidewall insulation pattern 150a may be formed on a sidewall of the lower pad pattern 112a. The sidewall insulation pattern 150a may include an insulation material having a high etch selectivity with respect to the conductive pattern 105a. In an implementation, the sidewall insulation pattern 150a may be formed of a nitride such as silicon nitride. In an implementation, the sidewall insulation pattern 150a may include silicon oxide. In an implementation, the sidewall insulation pattern 150a may have a structure in which a silicon oxide layer and a silicon nitride layer are stacked.

An upper surface of the sidewall insulation pattern 150a on a sidewall of one of the conductive patterns 105a may be higher than the upper surface of the conductive pattern 105a. In an implementation, the upper surface of the sidewall insulation pattern 150a on the sidewall of the adjacent conductive pattern 105a may protrude from the upper surface of the one of the conductive pattern 105a (e.g., may protrude farther from the substrate 100 in the vertical direction).

In an implementation, a width in the first direction of the sidewall insulation pattern 150a may be less than about ½ of a width in the first direction of the step portion of the conductive pattern 105a. In an implementation, the width in the first direction of the sidewall insulation pattern 150a may be greater than the first thickness of the insulation pattern 102b on the first region.

The upper pad pattern 114a may cover at least an upper surface of the lower pad pattern 112a. The upper pad pattern 114a may include silicon. In an implementation, the upper pad pattern 114a may include polysilicon. The upper pad pattern 114a may silicon formed by an epitaxial growth from the lower pad pattern 112a.

In an implementation, the upper surface of the upper pad pattern 114a may be coplanar with the upper surface of the sidewall insulation pattern 150a, or the upper surface of the upper pad pattern 114a may be lower than the upper surface of the sidewall insulation pattern 150a. In an implementation, a thickness of the upper pad pattern 114a (e.g., in the vertical direction) may be less than a thickness of the stacked structure including one of the conductive patterns 105a and one of the insulation patterns 102b.

In an implementation, the conductive pattern 105a and the upper pad pattern 114a may be stacked on a top of the conductive pattern structure 107b. In an implementation, an uppermost upper pad pattern 114a in the conductive pattern structure 107b may be on both the first and second regions.

The first insulating interlayer 118 may cover the conductive pattern structure 107b. The channel structure 130 electrically connected to the substrate 100 may pass through the conductive pattern structure 107b and the first insulating interlayer 118 on the first region. The second insulating interlayer 132 may be formed on the first insulating interlayer 118.

The contact plugs 142 passing through the first and second insulating interlayers 118 and 132 may contact the pad structures 116a, respectively. The pad structure 116a may include the lower pad pattern 112a and the upper pad pattern 114a stacked.

FIGS. 18 to 23 are cross-sectional views and plan views of stages in a method of manufacturing a semiconductor device in accordance with example embodiments.

Figure 18:
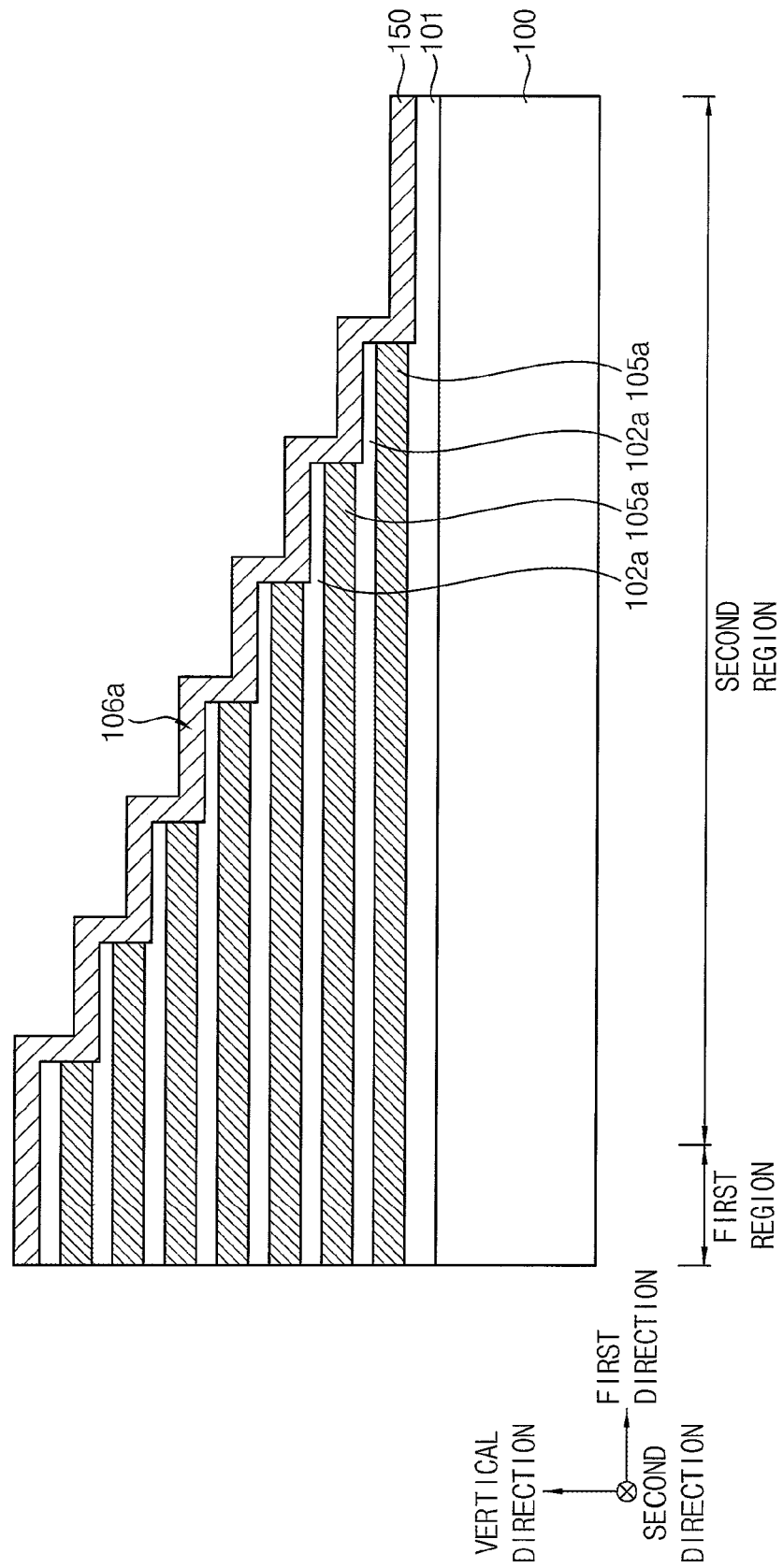
FIGS. 18 to 23 are cross-sectional views and plan views of stages in a method of manufacturing a semiconductor device in accordance with example embodiments.
Figure 19:
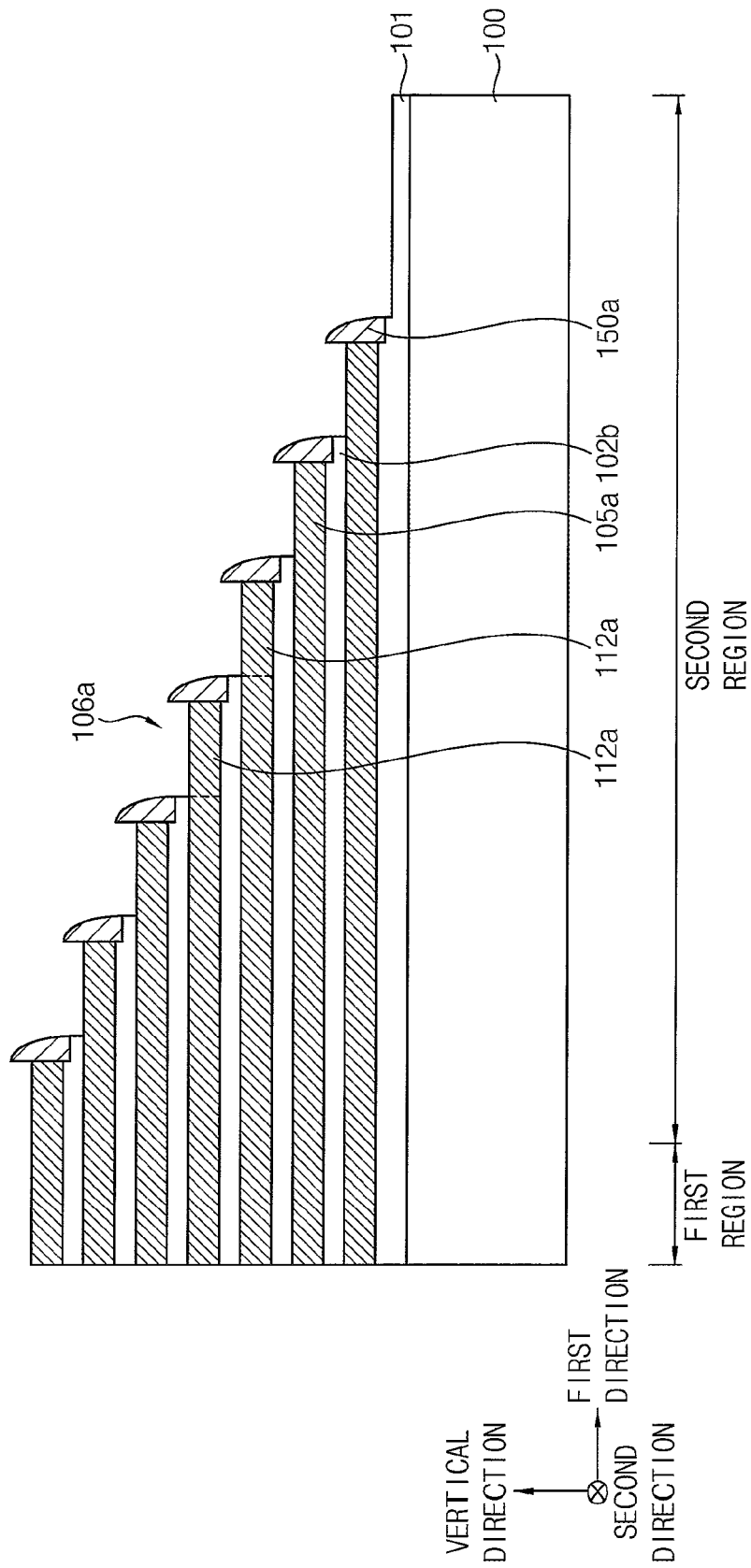
Figure 20:
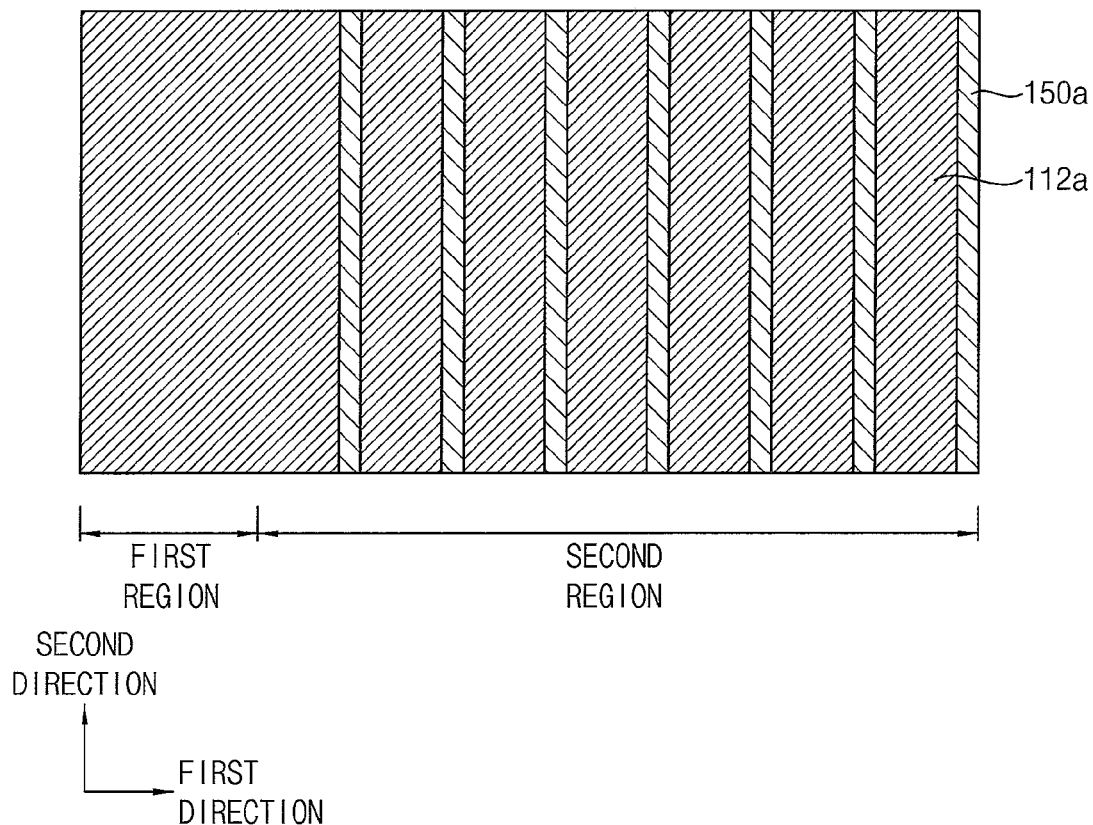
Figure 21:
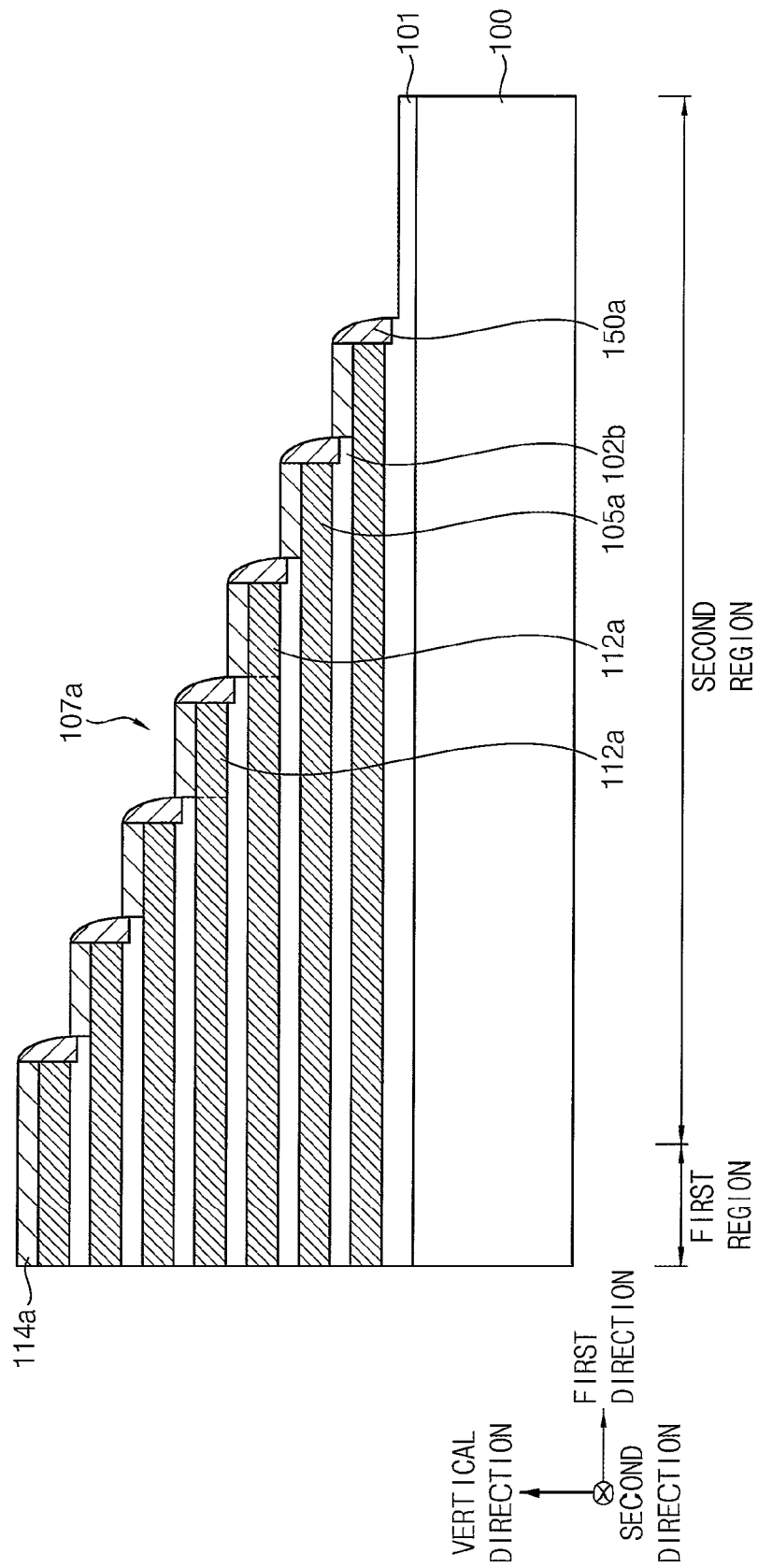
Figure 22:
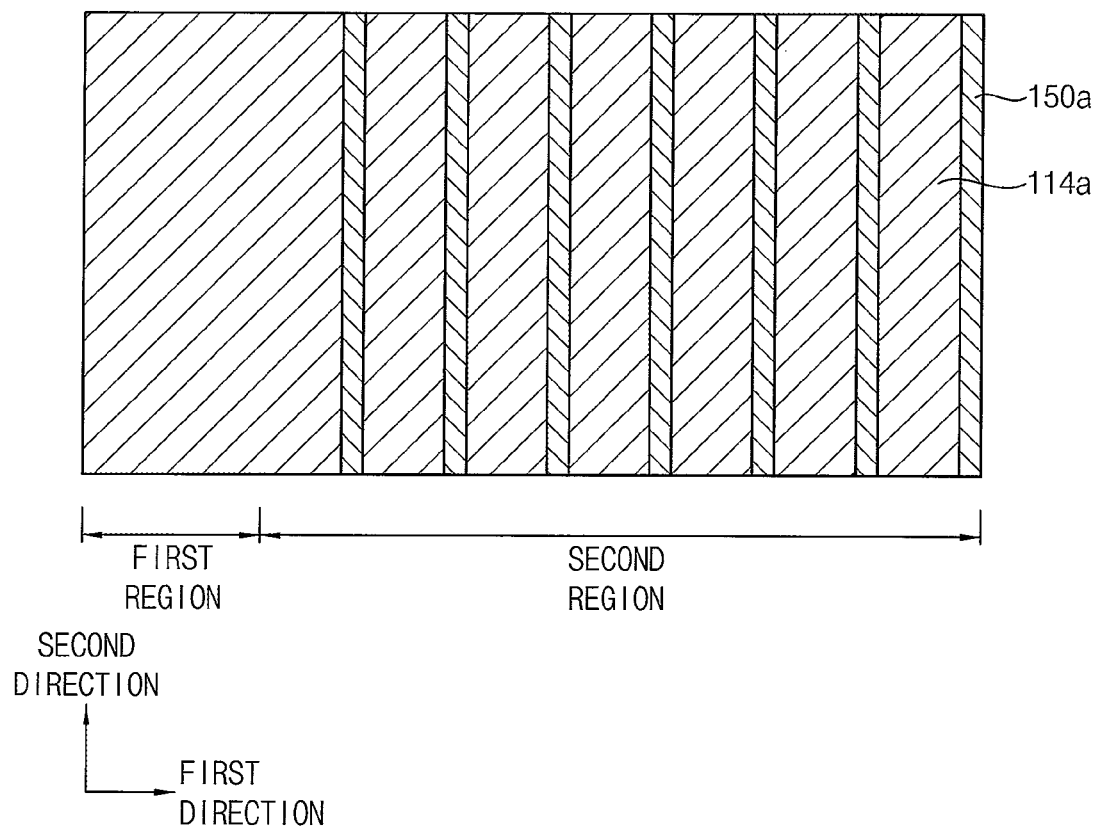

FIGS. 18, 19, 21 and 23 are cross-sectional views, and FIGS. 20 and 22 are plan views.

Referring to FIG. 18, first, processes as illustrated with reference to FIGS. 4 to 7 may be performed to form the first preliminary conductive pattern structure 106a on the lower insulation layer. The first preliminary conductive pattern structure 106a may include the conductive patterns 105a and the preliminary insulation patterns 102a alternately stacked.

A spacer insulation layer 150 may be conformally formed on the first preliminary conductive pattern structure 106a and the lower insulation layer 101. An upper surface of the spacer insulation layer 150 formed on at least a portion of the step portion of the first preliminary conductive pattern structure 106a may be flat.

When a thickness of the spacer insulation layer 150 is thick, a horizontal portion of the upper pad pattern subsequent formed may be decreased. In an implementation, the thickness of the spacer insulation layer 150 may be less than about ½ of a width in the first direction of the step portion in the first preliminary conductive pattern structure 106a. If the thickness of the spacer insulation layer 150 were to be too thin, a height of the upper pad pattern subsequent formed may be decreased. In an implementation, the thickness of the spacer insulation layer 150 may be greater than a vertical thickness of each of the preliminary insulation patterns 102a on the first region.

The spacer insulation layer 150 may include an insulation material having a high etch selectivity with respect to the conductive pattern 105a. In an implementation, the spacer insulation layer 150 may be formed of a nitride such as silicon nitride. In an implementation, the spacer insulation layer 150 may be formed of silicon oxide. In an implementation, the spacer insulation layer 150 may have a structure in which a silicon oxide layer and a silicon nitride layer are stacked.

Referring to FIGS. 19 and 20, the spacer insulation layer 150 may be anisotropically etched to form the sidewall insulation pattern 150a on a sidewall of the first preliminary conductive pattern structure 106a.

The sidewall insulation pattern 150a may help protect the conductive pattern 105a and the preliminary insulation pattern 102a of the step portion in the first preliminary conductive pattern structure 106a.

Subsequently, the preliminary insulation pattern 102a of the step portion in the first preliminary conductive pattern structure 106a adjacent to the sidewall insulation pattern 150a may be anisotropically etched to form an insulation pattern 102b.

In an implementation, the conductive pattern 105a may be exposed at the step portion adjacent to the sidewall insulation pattern 150a. The step portion in each of conductive patterns 105a may serve as a lower pad pattern 112a.

An upper surface of the sidewall insulation pattern 150a on the sidewall of the conductive pattern 105a may be higher (e.g., farther from the substrate 100 in the vertical direction) than an upper surface of the step portion of the conductive pattern. In an implementation, the upper surface of the sidewall insulation pattern 150a on the sidewall of the conductive pattern 105a may protrude from or beyond the upper surface of step portion of the conductive pattern 105. In an implementation, a recess defined by the sidewall insulation pattern 150a may be formed on the step portion of the conductive pattern 105.

Referring to FIGS. 21 and 22, a selective epitaxial growth process may be performed on the lower pad pattern 112a to form the upper pad pattern 114a. The upper pad pattern 114a may be formed by growing silicon using the lower pad pattern 112a including polysilicon as a seed. In an implementation, the upper pad pattern 114a may include polysilicon. By performing the processes, a second preliminary conductive pattern structure 107a may be formed.

In an implementation, the upper pad pattern 114a may be formed in the recess formed by the sidewall insulation pattern 150a. In an implementation, an upper surface of the upper pad pattern 114a may be coplanar with the upper surface of the sidewall insulation pattern 150a, or the upper surface of the upper pad pattern 114a may be lower than the upper surface of the sidewall insulation pattern 150a. If the upper surface of the upper pad pattern 114a were to be higher than the upper surface of the sidewall insulation pattern 150a, the upper pad patterns at levels could contact each other by or due to excessive growth of the upper pad pattern 114a.

In an implementation, the upper pad pattern 114a may be formed on an uppermost conductive pattern 105a in the first preliminary conductive pattern structure 106a. In an implementation, the conductive pattern 105a and the upper pad pattern 114a may be stacked on a top of the second preliminary conductive pattern structure 107a.

Figure 23:
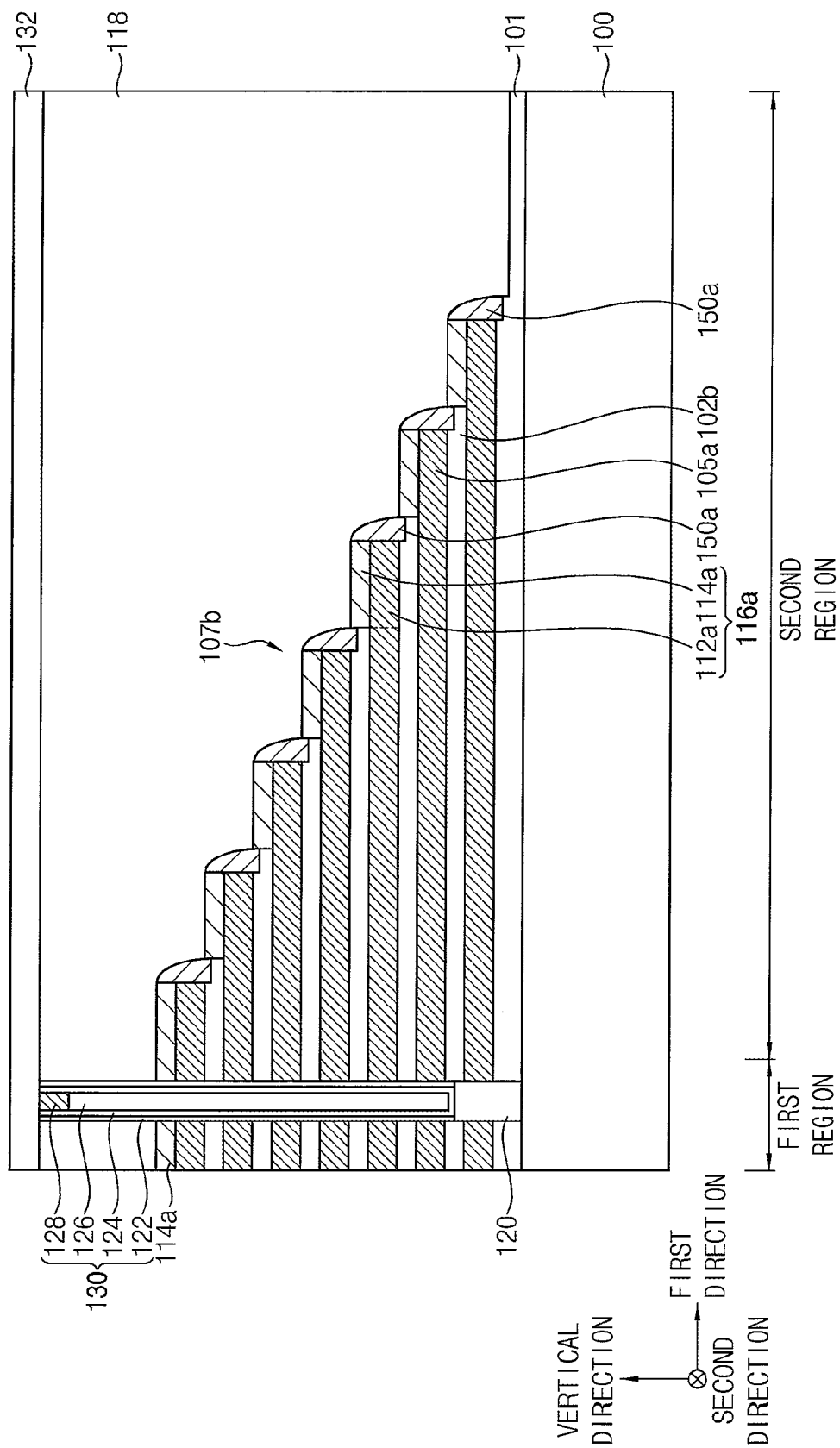

Referring to FIG. 23, the same processes as illustrated with reference to FIGS. 13 and 14 may be performed to form the conductive pattern structure 107b, the channel structure 130, the first insulating interlayer 118, and the second insulating interlayer 132. Further, the opening may be formed, and the insulation pattern may be formed in the opening.

Referring to FIGS. 16 and 17 again, the first and second insulating interlayers 118 and 132 may be etched to form contact holes exposing the pad structures 116a, respectively. In an implementation, a bottom of each of the contact holes may expose the lower pad pattern 112a or the upper pad pattern 114a.

Conductive layer may be formed in the contact holes, and thus conductive plugs may be formed in the contact holes, respectively.

Figure 24:
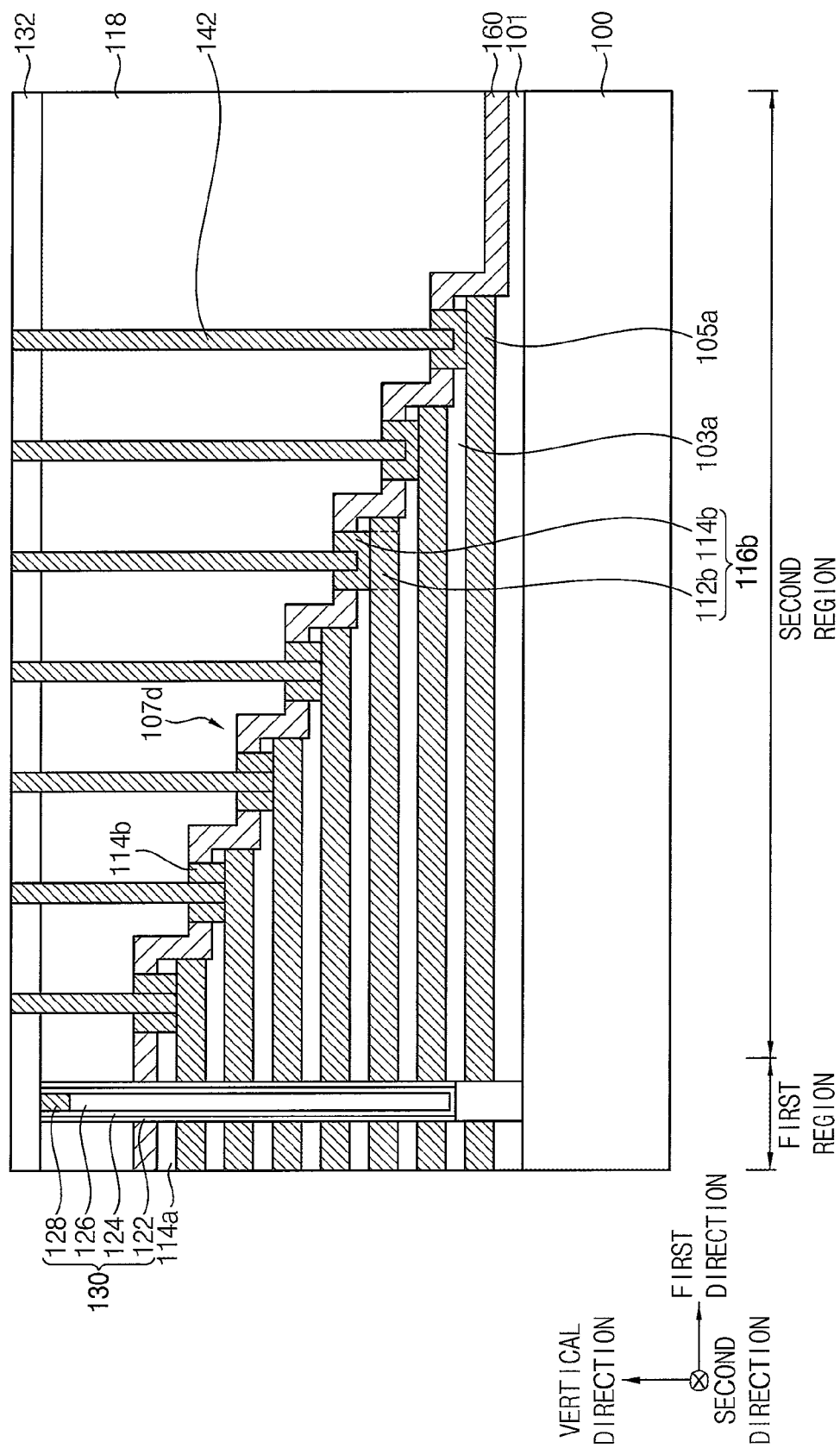
FIGS. 24 and 25 are a cross-sectional view and a plan view of a semiconductor device in accordance with example embodiments.
Figure 25:
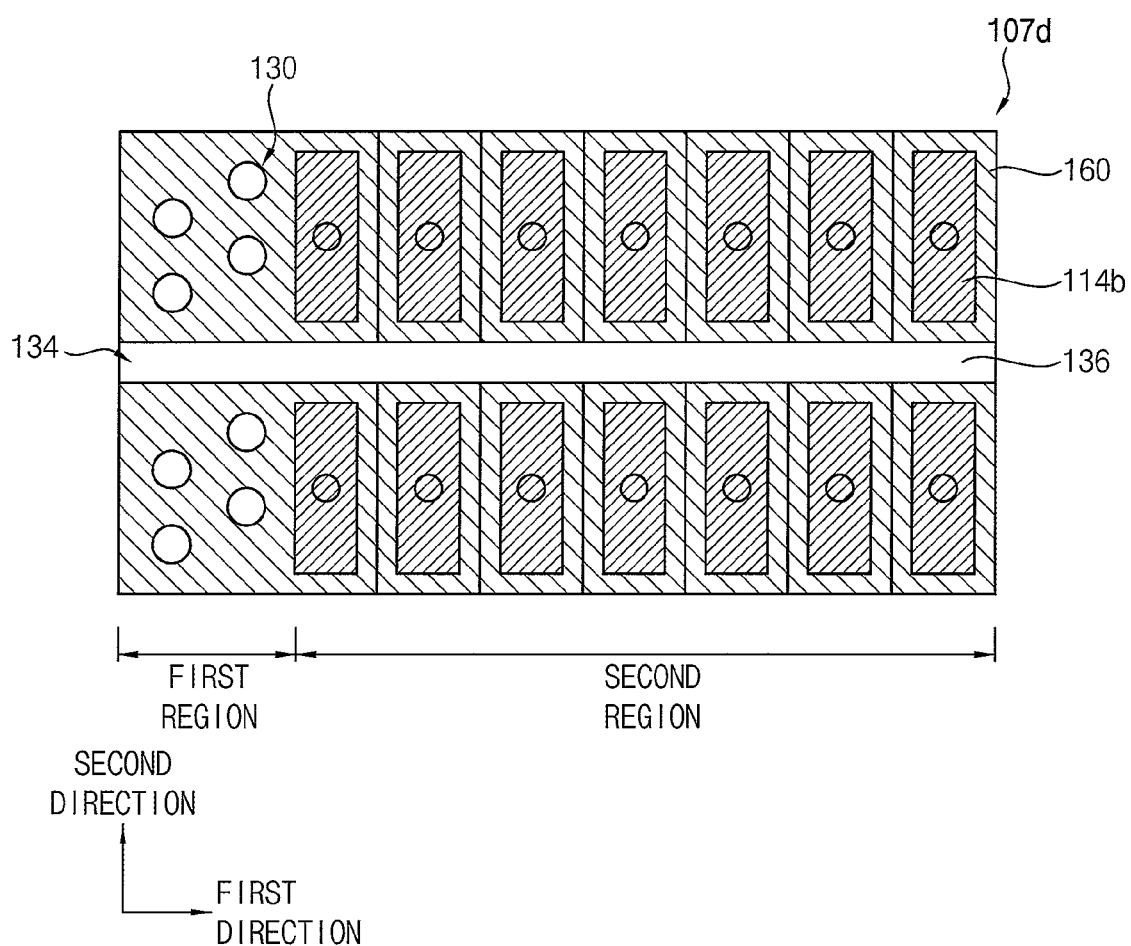

FIGS. 24 and 25 are a cross-sectional view and a plan view of a semiconductor device in accordance with example embodiments.

The semiconductor device may be substantially the same as the semiconductor device illustrated described with reference to FIGS. 1 to 3, except for a shape of the conductive pattern structure on the second region. Therefore, duplicate descriptions may be omitted or only briefly described.

Referring to FIGS. 24 and 25, an edge portion of a conductive pattern structure 107d on the second region may have a step shape.

The conductive pattern structure 107d on the second region may include the insulation patterns 103a, the conductive patterns 105a, the upper pad pattern 114b, and a spacer insulation layer 160. The insulation patterns 103a and the conductive patterns 105a in the conductive pattern structure 107d on the second region may extend from the insulation patterns 103a and the conductive patterns 105a in the conductive pattern structure 107d on the first region. Edges of the conductive patterns 105a on the second region may have a step shape. A portion of the step portion of each of the conductive patterns 105a may serve as a lower pad pattern 112b.

The spacer insulation layer 160 may cover a surface of a structure in which the insulation patterns 103a and conductive patterns 105a are stacked. The spacer insulation layer 160 may conformally cover a surface of the step portion of the conductive patterns 105a.

The spacer insulation layer 160 may include an insulation material having a high etch selectivity with respect to the conductive pattern 105a. In an implementation, the spacer insulation layer 160 may include a nitride such as silicon nitride. In an implementation, the spacer insulation layer 160 may include silicon oxide.

In an implementation, the spacer insulation layer 160 may have a thickness less than about ½ of a width in the first direction of the step portion of the conductive pattern structure 107d. In an implementation, the thickness of the spacer insulation layer 160 may be greater than a vertical thickness of each of the insulation patterns 103a on the first region.

The spacer insulation layer 160 may include holes 162 (refer to FIG. 27) exposing the step portion of the conductive patterns 105a. In an implementation, the holes 162 may pass through the spacer insulation layer 160 and the insulation pattern 103a on the step portion. The conductive pattern 105a exposed by a bottom of the hole 162 may serve as the lower pad pattern 112b.

The upper pad pattern 114b may be formed in each of the holes 162. The upper pad pattern 114b may contact the upper surface of the conductive pattern 105a. In an implementation, the upper pad pattern 114b may be formed on the lower pad pattern 112b.

The upper pad pattern 114b may include silicon. In an implementation, the upper pad pattern 114b may include polysilicon. The upper pad pattern 114b may include silicon formed by an epitaxial growth from the lower pad pattern 112b.

In an implementation, the upper pad pattern 114b may sufficiently fill the hole 162 or partially fill the hole 162. In an implementation, an upper surface of the upper pad pattern 114b may be coplanar with an upper entrance of the hole 162. In an implementation, the upper surface of the upper pad pattern 114b may be lower than the upper entrance of the hole 162.

In an implementation, a thickness of the upper pad pattern 114b may be less than a thickness of a stacked structure of one conductive pattern 105a and one insulation pattern 103a.

The upper pad pattern 114b may cover a portion of the upper surface of the step portion of the conductive pattern 105a. The upper pad pattern 114b on the upper surface of the step portion of the conductive pattern 105a may have isolated (e.g., discontinuous) shape. In an implementation, the upper pad pattern 114b having the isolated shape may be stacked on an uppermost of the conductive pattern 105a in the conductive pattern structure 107d.

The first insulating interlayer 118 may cover the conductive pattern structure 107d. The channel structure 130 may pass through the conductive pattern structure 107d and the first insulating interlayer 118 on the first region, and the channel structure 130 may be electrically connected to the substrate 100. The second insulating interlayer 132 may be formed on the first insulating interlayer 118.

The contact plugs 142 may pass through the first and second insulating interlayers 118 and 132, and the contact plugs 142 may contact the pad structures 116b in which the lower pad pattern 112b and the upper pad pattern 114b are stacked, respectively.

FIGS. 26 to 31 are cross-sectional views and plan views of stages in a method of manufacturing a semiconductor device in accordance with example embodiments.

Figure 26:
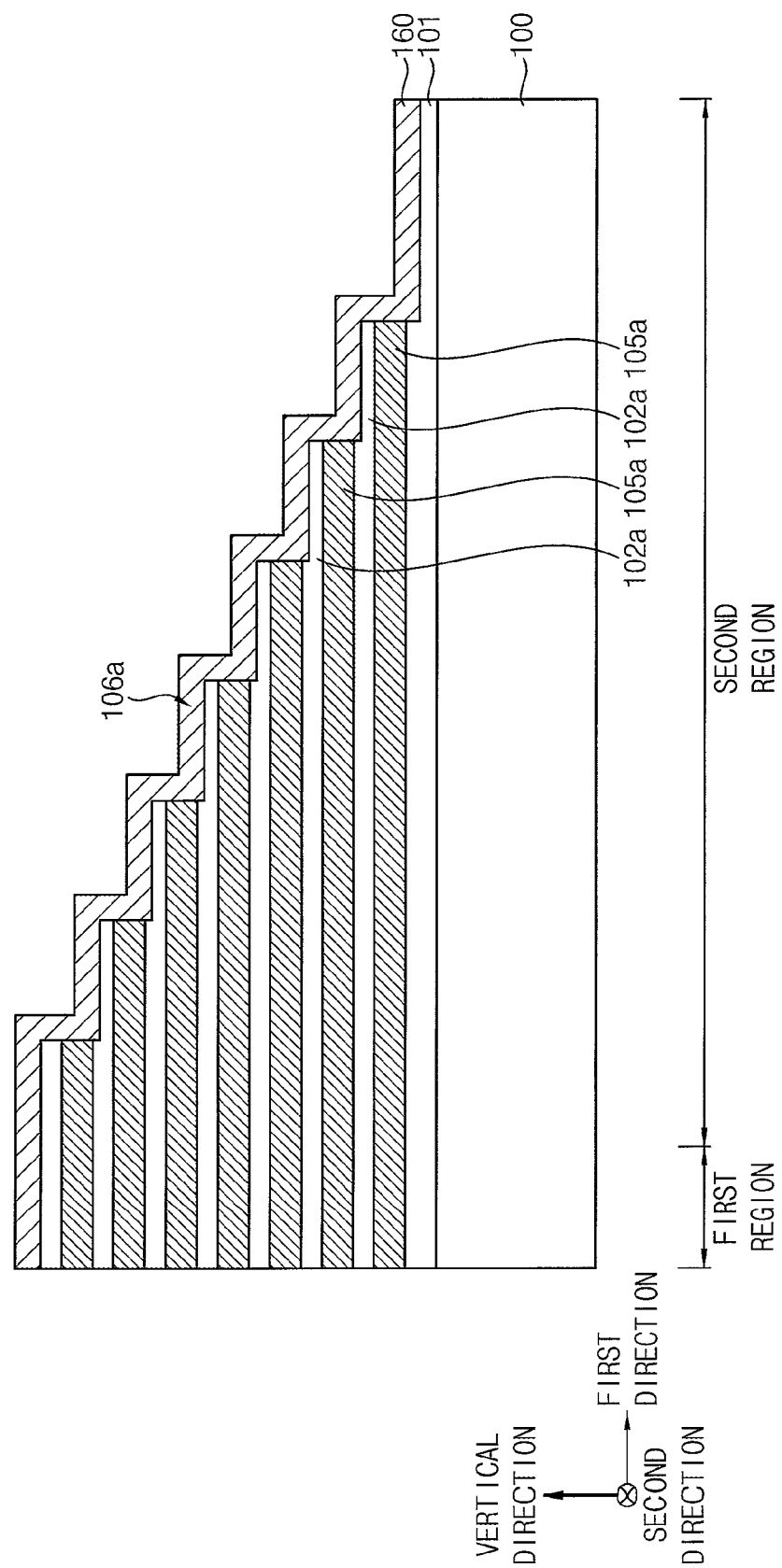
FIGS. 26 to 31 are cross-sectional views and plan views of stages in a method of manufacturing a semiconductor device in accordance with example embodiments.
Figure 27:
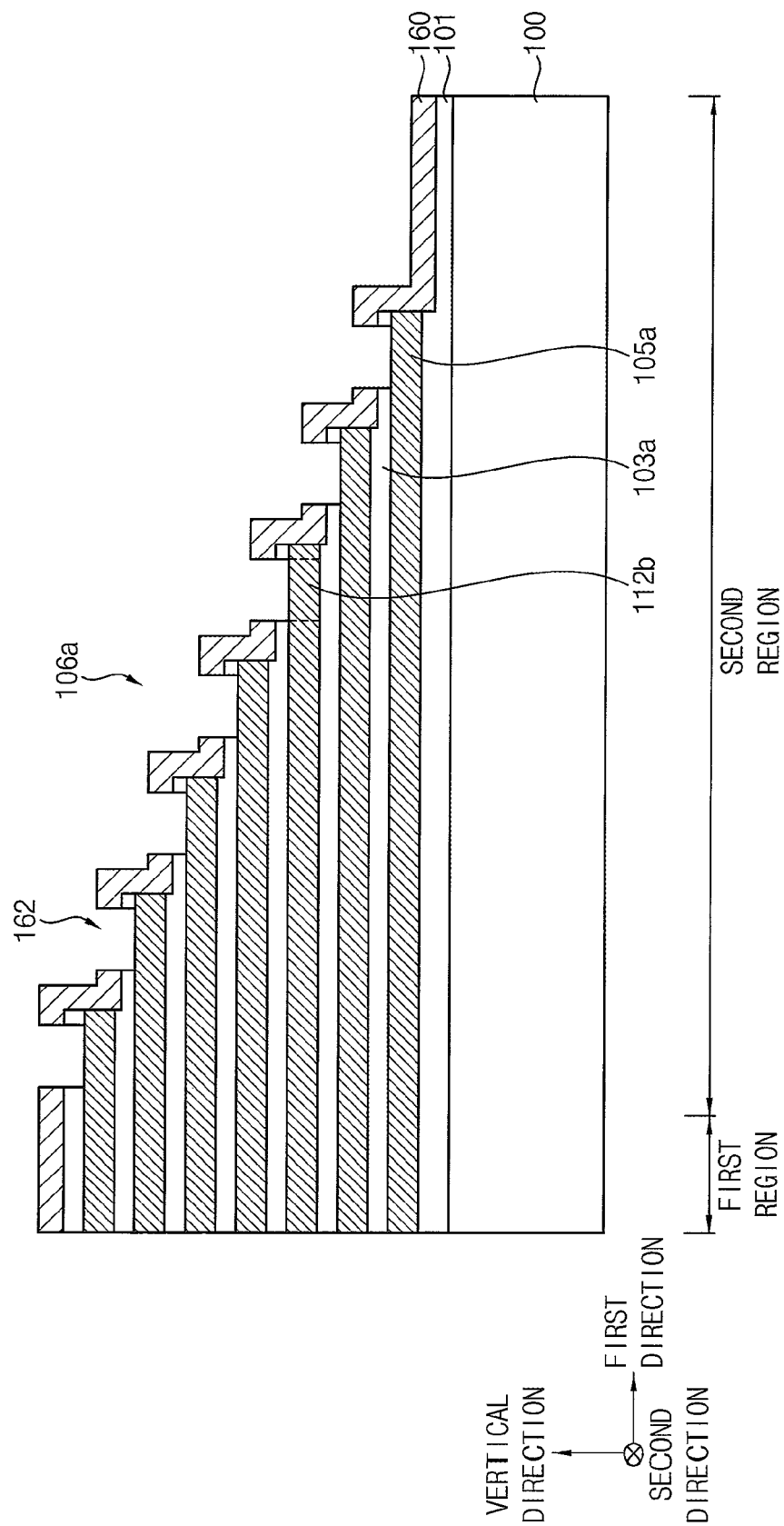
Figure 28:
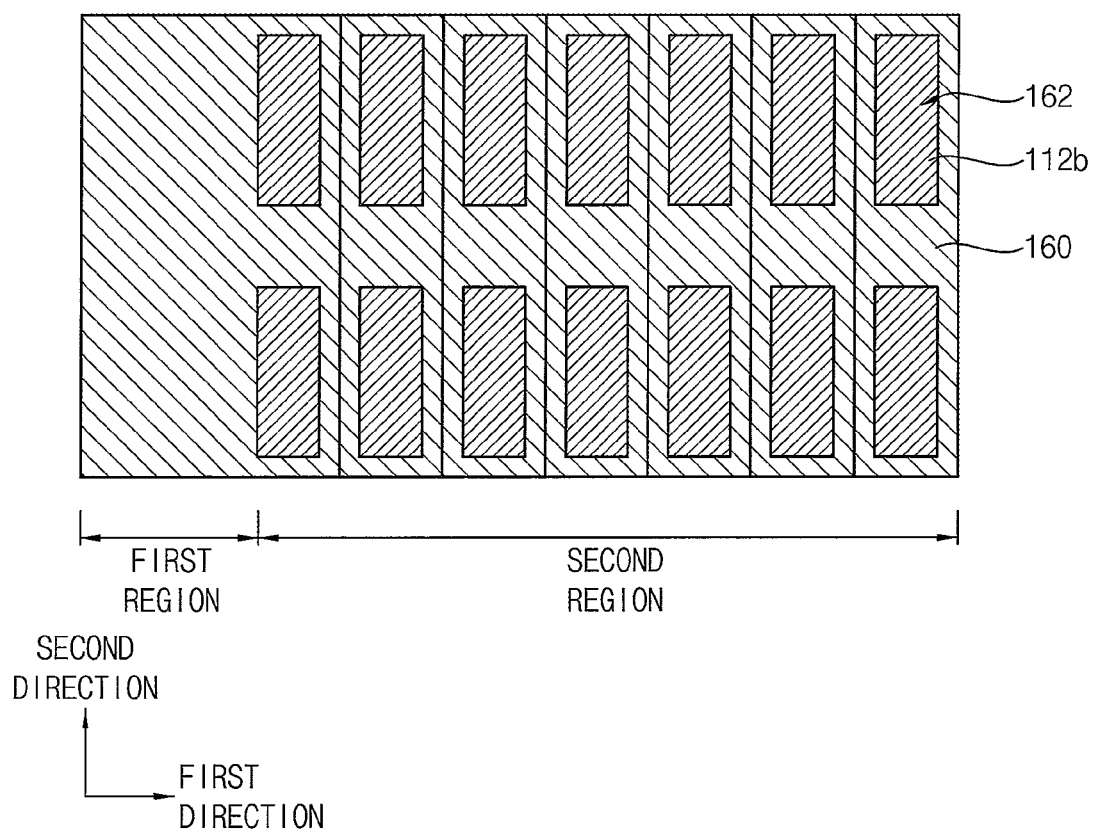
Figure 29:
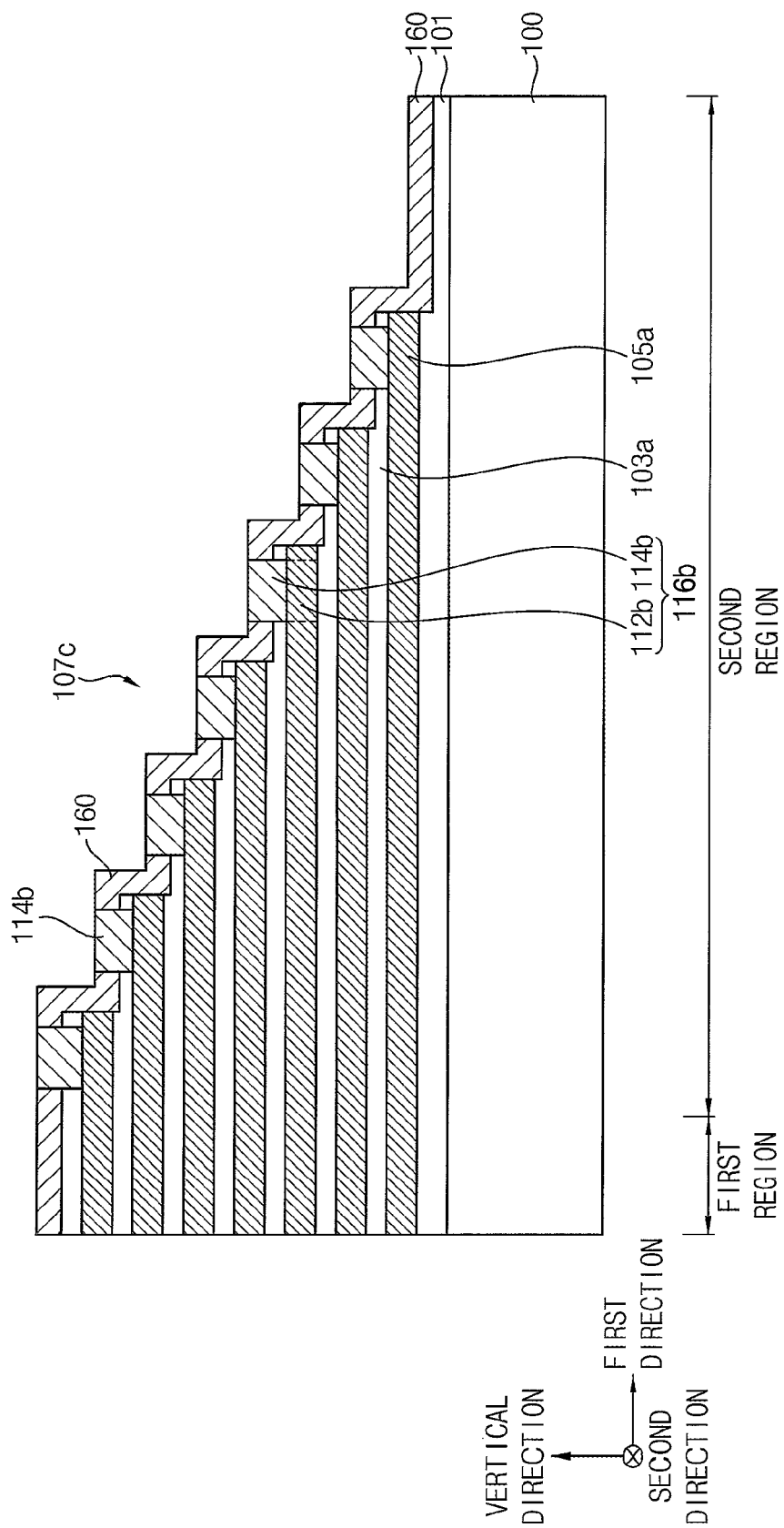
Figure 30:
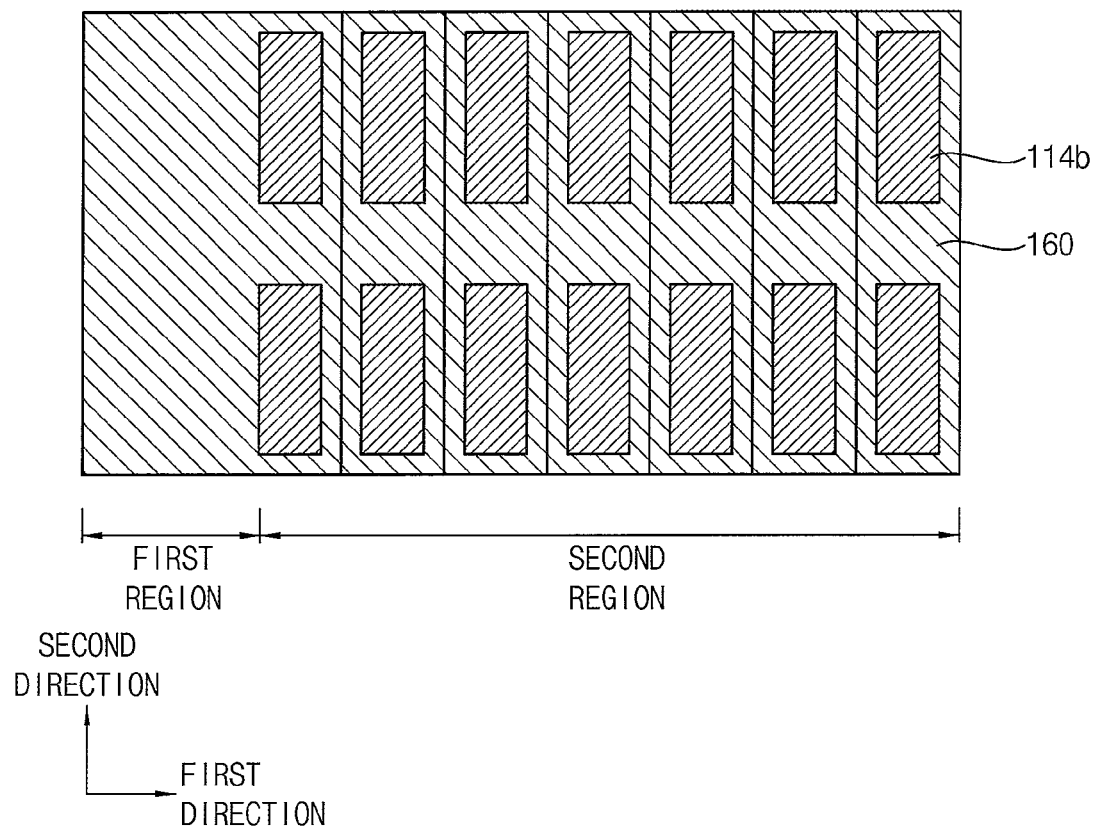
Figure 31:
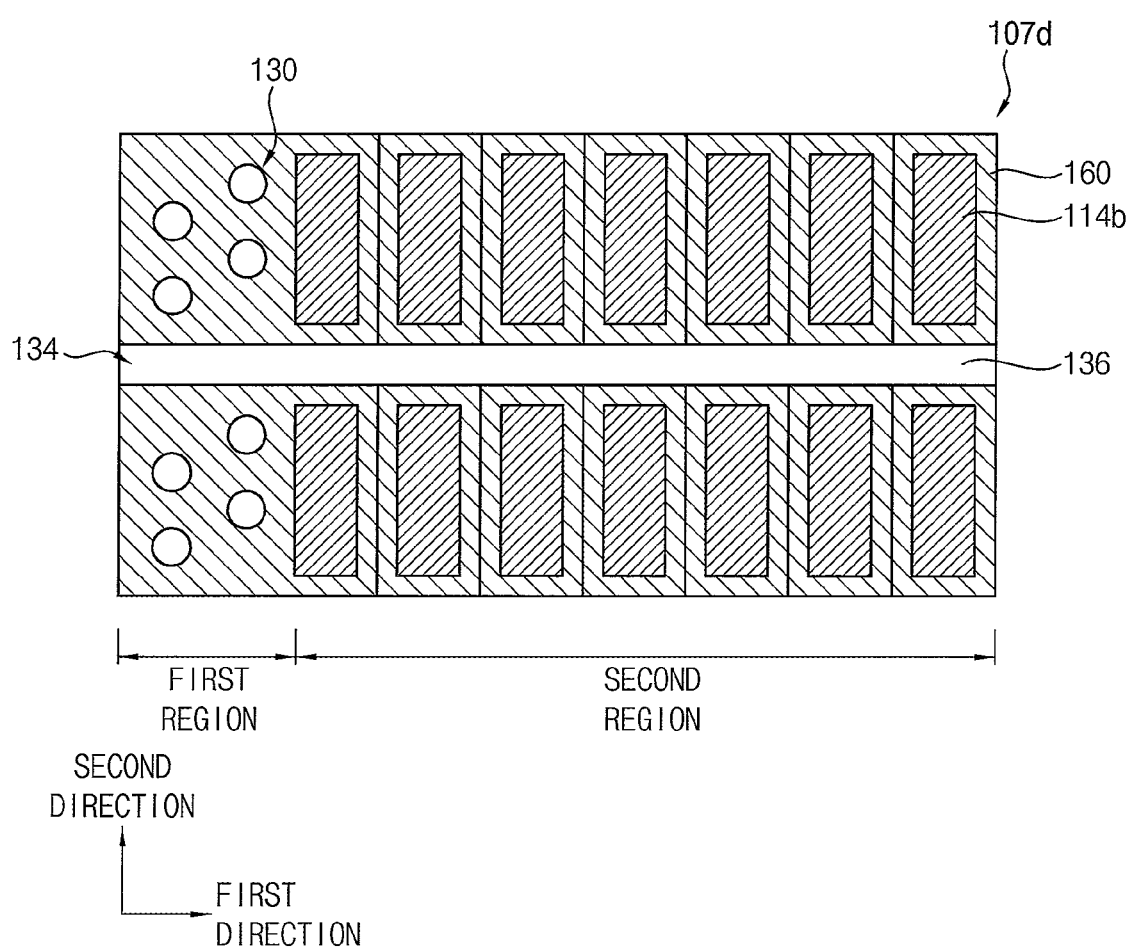

FIGS. 26, 27 and 29 are cross-sectional views, and FIGS. 28, 30 and 31 are plan views.

Referring to FIG. 26, first, the same processes as illustrated with reference to FIGS. 4 to 7 may be performed to form the first preliminary conductive pattern structure 106a on the lower insulation layer. The first preliminary conductive pattern structure 106a may include the conductive patterns 105a and the preliminary insulation patterns 102a alternately stacked.

A spacer insulation layer 160 may be conformally formed on the first preliminary conductive pattern structure 106a and the lower insulation layer 101. An upper surface of the spacer insulation layer 160 formed on at least a portion of the step portion in the first preliminary conductive pattern structure 106a may be flat.

If a thickness of the spacer insulation layer 160 were to be too thick, a horizontal portion of the upper pad pattern subsequently formed may be decreased. In an implementation, the spacer insulation layer 160 may have a thickness less than about ½ of a width in the first direction of the step portion in the first preliminary conductive pattern structure 106a. If the thickness of the spacer insulation layer 160 were to be too thin, a height of the upper pad pattern subsequently formed may be decreased. In an implementation, the thickness of the spacer insulation layer 160 may be greater than a vertical thickness of each of the preliminary insulation patterns 102a on the first region.

The spacer insulation layer 160 may include an insulation material having a high etch selectivity with respect to the conductive pattern 105a. In an implementation, the spacer insulation layer 160 may be formed of a nitride such as silicon nitride. In an implementation, the spacer insulation layer 160 may be formed of silicon oxide.

Referring to FIGS. 27 and 28, the spacer insulation layer 160 on the step portion in the first preliminary conductive pattern structure 106a and the preliminary insulation pattern 102a thereunder may be etched to form holes 162. The preliminary insulation pattern 102a may be etched into the insulation pattern 103a. An upper surface of the conductive pattern 105a may be exposed by a bottom of each of the holes 162. The conductive pattern 105a exposed by the hole 162 may serve as the lower pad pattern 112b.

Referring to FIGS. 29 and 30, a selective epitaxial growth process may be performed on the lower pad pattern 112b of step portion to form the upper pad pattern 114b. The upper pad pattern 114b may be formed by growing silicon using the lower pad pattern 112b including polysilicon as a seed. In an implementation, the upper pad pattern 114b may include polysilicon. By performing the processes, the second preliminary conductive pattern structure 107c may be formed.

In an implementation, the upper pad pattern 114b may be formed in each of the holes 162. In an implementation, the upper pad pattern 114b may sufficiently fill the hole 162 or may partially fill the hole 162.

The upper pad pattern 114b on the upper surface of the step portion of the conductive pattern 105a may have an isolated shape.

An upper pad pattern 114b having the isolated shape may be formed on an uppermost of the conductive pattern 105a in the first preliminary conductive pattern structure 106a.

Referring to FIG. 31, the same processes as illustrated with reference to FIGS. 13 and 14 may be performed to form the conductive pattern structure 107d, the channel structure 130, the first insulating interlayer 118, and the second insulating interlayer 132. In an implementation, the opening 134 may be formed, and the second insulation pattern 136 may be formed in the opening 134.

Referring to FIGS. 24 and 25 again, the first and second insulating interlayers 118 and 132 may be etched to form contact holes exposing the pad structure 116b in which the lower pad pattern 112b and the upper pad pattern 114b are stacked. In an implementation, a bottom of each of the contact holes may expose the lower pad pattern 112b or the upper pad pattern 114b.

A conductive layer may be formed in the contact holes, and thus the contact plugs 142 may be formed in the contact holes, respectively.

In the semiconductor device in accordance with example embodiments, defects of contact plugs connected to the conductive patterns may be decreased. The semiconductor device may be used in various electronic products.

One or more embodiments may provide a vertical type memory device.

One or more embodiments may provide a semiconductor device with reduced process defects.

In example embodiments, the semiconductor device may include the upper pad pattern formed on the step portion of the conductive pattern. Thus, a non-contact of the contact plug or a punching defect of the contact plug may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
conductive patterns on the substrate, the conductive patterns being spaced apart from each other in a vertical direction perpendicular to a surface of the substrate, and an edge of the conductive patterns including a step portion such that an end of one conductive pattern is not overlapped in the vertical direction with conductive patterns positioned thereover;
insulation patterns between the conductive patterns;
sidewall insulation patterns on sidewalls of the conductive patterns to cover the sidewalls of the conductive patterns;
upper pad patterns on upper surfaces of the step portion of the conductive patterns and upper surfaces of portions of the sidewall insulation patterns;
an insulating interlayer covering the conductive patterns, the insulation patterns, the sidewall insulation patterns, and the upper pad patterns; and
contact plugs passing through the insulating interlayer, the contact plugs contacting the upper pad patterns, respectively,
wherein substrate-facing sides of the upper pad patterns contact at least a portion of the upper surfaces of the sidewall insulation patterns.

2. The semiconductor device as claimed in claim 1, wherein the conductive patterns and the upper pad patterns each include polysilicon.

3. The semiconductor device as claimed in claim 2, wherein the upper pad patterns include polysilicon formed by an epitaxial growth from an upper surface of the conductive patterns.

4. The semiconductor device as claimed in claim 1, wherein the sidewall insulation patterns include an insulation material having a high etch selectivity to the conductive patterns and insulation patterns.

5. The semiconductor device as claimed in claim 1, wherein the upper surfaces of the sidewall insulation patterns and the upper surfaces of the step portions of the conductive patterns are coplanar with each other.

6. The semiconductor device as claimed in claim 1, wherein an end portion of one of the upper pad patterns protrudes laterally beyond an end portion of one of the conductive patterns contacting a substrate-facing side of the one upper pad pattern.

7. The semiconductor device as claimed in claim 1, wherein an upper surface of one upper pad pattern is closer to the substrate in the vertical direction than an upper surface of an adjacent sidewall insulation pattern that is one level higher than the one upper pad pattern is to the substrate in the vertical direction.

8. The semiconductor device as claimed in claim 1, wherein an upper surface of one sidewall insulation pattern is farther from the substrate in the vertical direction than an upper surface of one conductive pattern on a step portion contacting the one sidewall insulation pattern is to the substrate in the vertical direction.

9. The semiconductor device as claimed in claim 1, wherein the upper pad pattern covers an entire upper surface of the step portion of the conductive pattern that is not covered by the insulation patterns.

10. The semiconductor device as claimed in claim 1, wherein a bottom of each of the contact plugs is at an upper surface or an inner portion of a stacked structure including the upper pad pattern and a lower conductive pattern contacting the upper pad pattern.

11. The semiconductor device as claimed in claim 1, wherein one of the insulation patterns contacting a substrate-facing side of an overlying one of the conductive patterns has a length in a first direction parallel to the surface of the substrate that is greater than a length in the first direction of the overlying conductive pattern.

12. A semiconductor device, comprising:
a substrate;
conductive patterns on the substrate, the conductive patterns being spaced apart from each other in a vertical direction perpendicular to a surface of the substrate, the conductive patterns including polysilicon, and an edge of the conductive patterns including a step portion such that an end of one conductive pattern is not overlapped in the vertical direction with conductive patterns positioned thereover;
insulation patterns between the conductive patterns;
sidewall insulation patterns on the sidewalls of the conductive patterns to cover sidewalls of the conductive patterns, the sidewall insulation patterns being on the insulation patterns, respectively;
upper pad patterns on upper surfaces of the step portion of the conductive patterns and a portion of the sidewall insulation patterns, the upper pad patterns including polysilicon;
an insulating interlayer covering the conductive patterns, the insulation patterns, the sidewall insulation patterns, and the upper pad patterns;
a channel structure passing through the conductive patterns and the insulation patterns, the channel structure being connected to the substrate, and the channel structure including a dielectric layer structure, a channel, a buried insulation pattern, and an upper conductive pattern; and
contact plugs passing through the insulating interlayer, the contact plugs contacting the upper pad patterns, respectively,
wherein an upper surface of one upper pad pattern is closer to the substrate in the vertical direction than an upper surface of an adjacent sidewall insulation pattern that is one level higher than the one upper pad pattern is to the substrate in the vertical direction, and
wherein one of the insulation patterns contacting a substrate-facing side of an overlying one of the conductive patterns has a length in a first direction parallel to the surface of the substrate that is greater than a length in the first direction of the overlying conductive pattern.

13. The semiconductor device as claimed in claim 12, wherein the upper surfaces of the sidewall insulation patterns and the upper surfaces of the step portion of the conductive patterns are coplanar with each other.

14. A semiconductor device, comprising:
a substrate;
conductive patterns on the substrate, the conductive patterns being spaced apart from each other in a vertical direction perpendicular to a surface of the substrate, the conductive patterns including polysilicon, and an edge of the conductive patterns including a step portion such that an end of one conductive pattern is not overlapped in the vertical direction with conductive patterns positioned thereover;
insulation patterns between the conductive patterns;
sidewall insulation patterns on the sidewalls of the conductive patterns, respectively, to cover sidewalls of the conductive patterns;
upper pad patterns on upper surfaces of the step portion of the conductive patterns, the upper pad patterns including polysilicon;
an insulating interlayer covering the conductive patterns, the insulation patterns, the sidewall insulation patterns, and the upper pad patterns; and
contact plugs passing through the insulating interlayer, the contact plugs contacting the upper pad patterns, respectively,
wherein:
a bottom of each of the contact plugs is at an upper surface or an inner portion of a stacked structure including one upper pad pattern and a lower conductive pattern contacting the one upper pad pattern,
a thickness of each of the upper pad patterns in the vertical direction is less than a thickness in the vertical direction of a structure in which one conductive pattern and one insulation pattern are stacked, and
an upper surface of the sidewall insulation pattern and an upper surface of the step portion of the conductive pattern are coplanar with each other.

15. The semiconductor device as claimed in claim 14, wherein an end portion of the upper pad pattern protrudes laterally beyond an end portion of the lower conductive pattern contacting a substrate-facing side of the upper pad pattern.

16. The semiconductor device as claimed in claim 14, wherein an upper surface of the sidewall insulation pattern is farther from the substrate in the vertical direction than an upper surface of the conductive pattern on a step portion contacting the sidewall insulation pattern is to the substrate in the vertical direction.

17. The semiconductor device as claimed in claim 14, wherein the upper pad pattern covers an entire upper surface of the step portion of the conductive pattern that is not covered by the insulation patterns.

* * * * *